(12) United States Patent
Ohsawa et al.

(10) Patent No.: US 9,633,708 B2
(45) Date of Patent: Apr. 25, 2017

(54) SEMICONDUCTOR STORAGE DEVICE USING STT-MRAM

(71) Applicant: TOHOKU UNIVERSITY, Sendai-shi (JP)

(72) Inventors: Takashi Ohsawa, Sendai (JP); Tetsuo Endoh, Sendai (JP)

(73) Assignee: Tohoku University, Sendai-shi (JP)

( * ) Notice: Subject to any disclaimer, the term of this patent is extended or adjusted under 35 U.S.C. 154(b) by 0 days.

(21) Appl. No.: 15/101,809

(22) PCT Filed: Dec. 3, 2014

(86) PCT No.: PCT/JP2014/082040
§ 371 (c)(1),
(2) Date: Jun. 3, 2016

(87) PCT Pub. No.: WO2015/083754
PCT Pub. Date: Jun. 11, 2015

(65) Prior Publication Data
US 2016/0372174 A1 Dec. 22, 2016

(30) Foreign Application Priority Data

Dec. 5, 2013 (JP) .................... 2013-252574

(51) Int. Cl.
*G11C 5/08* (2006.01)
*G11C 11/16* (2006.01)

(52) U.S. Cl.
CPC ...... *G11C 11/1673* (2013.01); *G11C 11/1697* (2013.01)

(58) Field of Classification Search
None
See application file for complete search history.

(56) References Cited

U.S. PATENT DOCUMENTS

2013/0322161 A1    12/2013  Noguchi et al.
2016/0293268 A1*   10/2016  Jan .................... G11C 11/1673

FOREIGN PATENT DOCUMENTS

| JP | 2002260377 A | 9/2002 |
| JP | 2005518627 A | 6/2005 |
| JP | 2011-204287 | 10/2011 |
| JP | 5492324 B1 | 5/2014 |

OTHER PUBLICATIONS

Int'l. Search Report issued in Int'l. App. No. PCT/JP2014/082040, dated Jan. 13, 2015.

(Continued)

*Primary Examiner* — Harry W Byrne
*Assistant Examiner* — Sultana Begum
(74) *Attorney, Agent, or Firm* — Greer Burns & Crain Ltd.

(57) ABSTRACT

A memory circuit (100) includes a plurality of memory cells (50), an N-type MOSFET (30a) and an N-type MOSFET (30b). The drain of the N-type MOSFET (30a) is connected to one of a pair of bit lines, and the drain of the N-type MOSFET (30b) is connected to the other of the pair of bit lines. The gate of the N-type MOSFET (30a) is connected to the drain of the N-type MOSFET (30b), and the gate of the N-type MOSFET (30b) is connected to the drain of the N-type MOSFET (30a).

12 Claims, 33 Drawing Sheets

(56) References Cited

OTHER PUBLICATIONS

Keiko Abe et al.; "Hierarchical Cache Memory based on MRAM and Nonvolatile SRAM with Perpendicular Magnetic Tunnel Junctions for Ultra Low Power System"; SSDM 2010; pp. 1144-1145; Sep. 2010.

Shuu'ichirou Yamamoto et al.; "nonvolatile Static Random Access Memory Using Magnetic Tunnel Junctions with Current-Induced Magnetization Switching Architecture"; Japanese Journal of Applied Physics 48 (2009); pp. 1-7.

Takashi Ohsawa et al.; "High-Density and Low-Power Nonvolatile Static Random Access Memory Using Spin-Transfer-Torque Magnetic Tunnel Junction"; Jpn. J. Appl. Phys. 51(2012); pp. 1-6.

\* cited by examiner

| Memory Cell | NMOS/MTJ Hybrid Type | NMOS/MTJ Hybrid Type | CMOS/MTJ Add-on Type | CMOS/MTJ Hybrid Type | | 6TSRAM |
|---|---|---|---|---|---|---|
| | 2T2MTJ | 4T2MTJ | 6T2MTJ-1 | 6T2MTJ-2 | LOP | LSTP |
| $V_{dd}$ | 0.9V | 0.9V | 1.2V | 1.9V | | 0.9V |
| Total Current/32MB including only write cycles (most severe condition for STT-MRAMs) @15ns | 77mA | 70mA | 121mA | 164mA | 1.46A | 138mA |
| Write Current/64B (Write Current/cell) | 70mA 136μA | 63mA 123μA | 108mA 210μA | 143mA 279μA | 0.18mA 0.36 μA) | |
| Array Control Current/64B | 7mA | 7mA | 13mA | 21mA | 4mA | |
| Static Current/32MB | 0 | 0 | 0 | 0 | 1.46A | 134mA |
| Components | | | | | | |

Fig.6

OPERATING PROPERTIES OF MEMORY CIRCUITS SHOWN IN FIG. 1, FIG. 2

OPERATING PROPERTIES OF MEMORY CIRCUIT SHOWN IN FIG. 9

P-driver/N-selector

N-driver/N-selector

P-driver/P-selector

SEMICONDUCTOR STORAGE DEVICE USING STT-MRAM

This is a National Phase Application filed under 35 U.S.C. §371, of International Application No. PCT/JP2014/082040, filed Dec. 3, 2014.

TECHNICAL FIELD

The present disclosure relates to a semiconductor memory device that uses STT-MRAM.

BACKGROUND ART

Spin transfer torque-magnetoresistive random access memory (STT-MRAM) is attracting attention as memory that uses a magnetic tunneling junction (MTJ) device, which is a memory device in which resistance can change. STT-MRAM is non-volatile memory capable of high speeds and rewrite tolerance close to that of dynamic random access memory (DRAM). Given these properties, various inquiries are being made regarding the use of STT-MRAM in high-speed memory such as cache memory and/or the like.

Memory cells that use MTJ devices (hereafter referred to as MTJs) include a 1T1MTJ configuration comprising one metal oxide semiconductor field effect transistor (MOSFET) and one MTJ. In this configuration, for example one end of the MTJ is connected to a bit line and the other end is connected to the drain of the MOSFET, which is a selection device. The MOSFET's source is connected to a source line, and the gate is connected to a word line. When a selection signal from the word line is input, the MOSFET, which is a selection device, turns on and an electric circuit connecting the source line and the bit line including the MTJ and the MOSFET is connected. Through this, current flows in the MTJ, and reading from or writing to the MTJ becomes possible.

The 1T1MTJ configuration offers the advantages that the area occupied by the memory cell is small so the configuration is suitable for high integration. However, the 1T1MTJ configuration poses the problems that output signals are small, high-speed sensing is difficult because a reference current (or voltage) is necessary, and access times are long. Consequently, there are cases in which a cell configuration with two MTJs arranged as a differential pair is employed.

For example, in FIG. 1 of Non Patent Literature 1, an example of a memory cell with a 4T2MTJ configuration (four transistors (MOSFETs) and two MTJs) is noted.

In addition, in FIG. 1(a) of Non Patent Literature 2, an example of a circuit with a 6T2MTJ configuration is noted. Moreover, in FIG. 8(a) of Non Patent Literature 2, an example of a circuit with an 8T2MTJ configuration is noted.

In addition, in Non Patent Literature 3, a different example of a circuit with a 6T2MTJ configuration is noted. This literature notes that the 6T2MTJ configuration can be utilized as secondary cache.

When configuring the STT-MRAM, arranging memory cells having a differential pair configuration as described above in a matrix shape is necessary. However, when memory cells are arranged in a matrix shape, the problem exists that sub-threshold current (weak inverted current) from the driving MOSFET flows to the MTJ, and a leak current is generated. This leak current is multiplied in accordance with increases in the number of memory cells.

To cope with this problem, a gating method that interrupts the supply of the power source to this circuit is employed during the time when the circuit is not active.

There are a variety of methods of power gating. For example, in two-dimensional power gating (coarse power gating), a power line driver is positioned for each subarray including a plurality of memory cells. One power line driver controls the power source supply to the plurality of memory cells included in the assigned subarray.

In addition, with one-dimensional power gating (fine power gating), power drivers are assigned to each row (or column) of a memory cell array. One power driver controls the power source supply to memory cells arranged in the corresponding row (or column).

When the same number of memory cells is arranged, fine power grating uses a larger number of power drivers than coarse power grating, so the area monopolized by the circuit becomes larger. When the number of power drivers is simply reduced in order to lessen the area monopolized by the circuit, effects emerge such as wake up time becoming slower and operating current becoming larger, and these have an ill effect on memory performance.

CITATION LIST

Non Patent Literature

Non Patent Literature 1: T. Ohsawa et al., "Hi-Density and Low-Power Nonvolatile Static Random Access Memory Using Spin-Transfer-Torque Magnetic Tunnel Junction", Japanese Journal of Applied Physics 51, 2012, pp. 02BD01-1-02BD01-6.

Non Patent Literature 2: S. Yamamoto et al., "Nonvolatile Static Random Access Memory Using Magnetic Tunnel Junctions with Current-Induced Magnetization Switching Architecture", Japanese Journal of Applied Physics 48, 2009, pp. 043001-1-043001-7.

Non Patent Literature 3: K. Abe et al., "Hierarchical Cache Memory based on MRAM and Nonvolatile SRAM with Perpendicular Magnetic Tunnel Junctions for Ultra Low Power System", Solid State Devices Materials 2010, pp. 1144-1145.

SUMMARY OF INVENTION

Technical Problem

Accordingly, in order to make STT-MRAM high-speed and large-capacity, further shrinking the area monopolized by memory cells is necessary.

In addition, making memory high-speed is further sought accompanying increases in CPU speed and increases in memory capacity.

In consideration of the foregoing, an objective of the present disclosure is to shrink area monopolized by STT-MRAM memory cells.

In addition, another objective of the present disclosure is to increase the speed of memory access.

Solution to Problem

A semiconductor memory device comprising:
a plurality of memory cells, each comprising a first MOSFET connected to one each of a pair of bit lines and a pair of source lines, a second MOSFET connected to the other of the pair of bit lines and the pair of source lines, and a pair of MTJs connected in series to the first MOSFET and the second MOSFET;
a third MOSFET; and
a fourth MOSFET;

wherein the drain of the third MOSFET is connected to one of the pair of bit lines, the drain of the fourth MOSFET is connected to the other of the pair of bit lines, the gate of the third MOSFET is connected to the drain of the fourth MOSFET and the gate of the fourth MOSFET is connected to the drain of the third MOSFET.

The semiconductor memory device may be such that the first MOSFET and the second MOSFET are MOSFETs of a first conduction type, and the third MOSFET and the fourth MOSFET are MOSFETs of a second conduction type differing from the first conduction type.

Furthermore, the semiconductor memory device may be such that:

the drain of the third MOSFET is connected to one of the pair of bit lines via a fifth MOSFET, and the drain of the fourth MOSFET is connected to the other of the pair of bit lines via a sixth MOSFET; and the fifth MOSFET and the sixth MOSFET are MOSFETs of the second conduction type.

For example, the semiconductor memory device may be such that:

the sources of the third MOSFET and the fourth MOSFET are connected to a first common node, and the first common node is connected to a ground voltage or a power source voltage via a seventh MOSFET; and the seventh MOSFET is a MOSFET of the second conduction type.

For example, the semiconductor memory device may be such that:

the drain of an eighth MOSFET is connected to the drain of the third MOSFET, the drain of a ninth MOSFET is connected to the drain of the fourth MOSFET, the drain of the eighth MOSFET is connected to the gate of the ninth MOSFET, and the drain of the ninth MOSFET is connected to the gate of the eighth MOSFET; and the eighth MOSFET and the ninth MOSFET are MOSFETs of the first conduction type.

Furthermore, the semiconductor memory device may be such that:

the sources of the eighth MOSFET and the ninth MOSFET are connected to a second common node, and the second common node is connected to a power source voltage or a ground voltage via a tenth MOSFET; and the tenth MOSFET is a MOSFET of the first conduction type.

When the tenth MOSFET turns on, the first MOSFET and the second MOSFET may turn off.

Or, the semiconductor memory device may be such that:

the drain of an eighth MOSFET is connected to the drain of the third MOSFET, the drain of a ninth MOSFET is connected to the drain of the fourth MOSFET, the drain of the eighth MOSFET is connected to the gate of the ninth MOSFET, and the drain of the ninth MOSFET is connected to the gate of the eighth MOSFET;

the eighth MOSFET and the ninth MOSFET are MOSFETs of the first conduction type;

the sources of the eighth MOSFET and the ninth MOSFET are connected to a second common node, and the second common node is connected to a power source voltage or a ground voltage via a tenth MOSFET;

the tenth MOSFET is a MOSFET of the first conduction type; and when the tenth MOSFET turns on, the fifth MOSFET and the sixth MOSFET turn off.

For example, the semiconductor memory device may be such that:

the pair of source lines is connected to a power source voltage or a ground voltage via an eleventh MOSFET and a twelfth MOSFET, respectively; and the eleventh MOSFET and the twelfth MOSFET are MOSFETs of the first conduction type.

Advantageous Effects of Invention

With the present disclosure, shrinking of the memory cell area of an STT-MRAM can be realized.

BRIEF DESCRIPTION OF DRAWINGS

FIG. 6 is a drawing showing operating currents of multiple types of STT-MRAM with a differential pair configuration;

DESCRIPTION OF EMBODIMENTS

Below, a memory circuit according to exemplary embodiments of the present disclosure are described with reference to the drawings.

First Exemplary Embodiment

Figure 1:
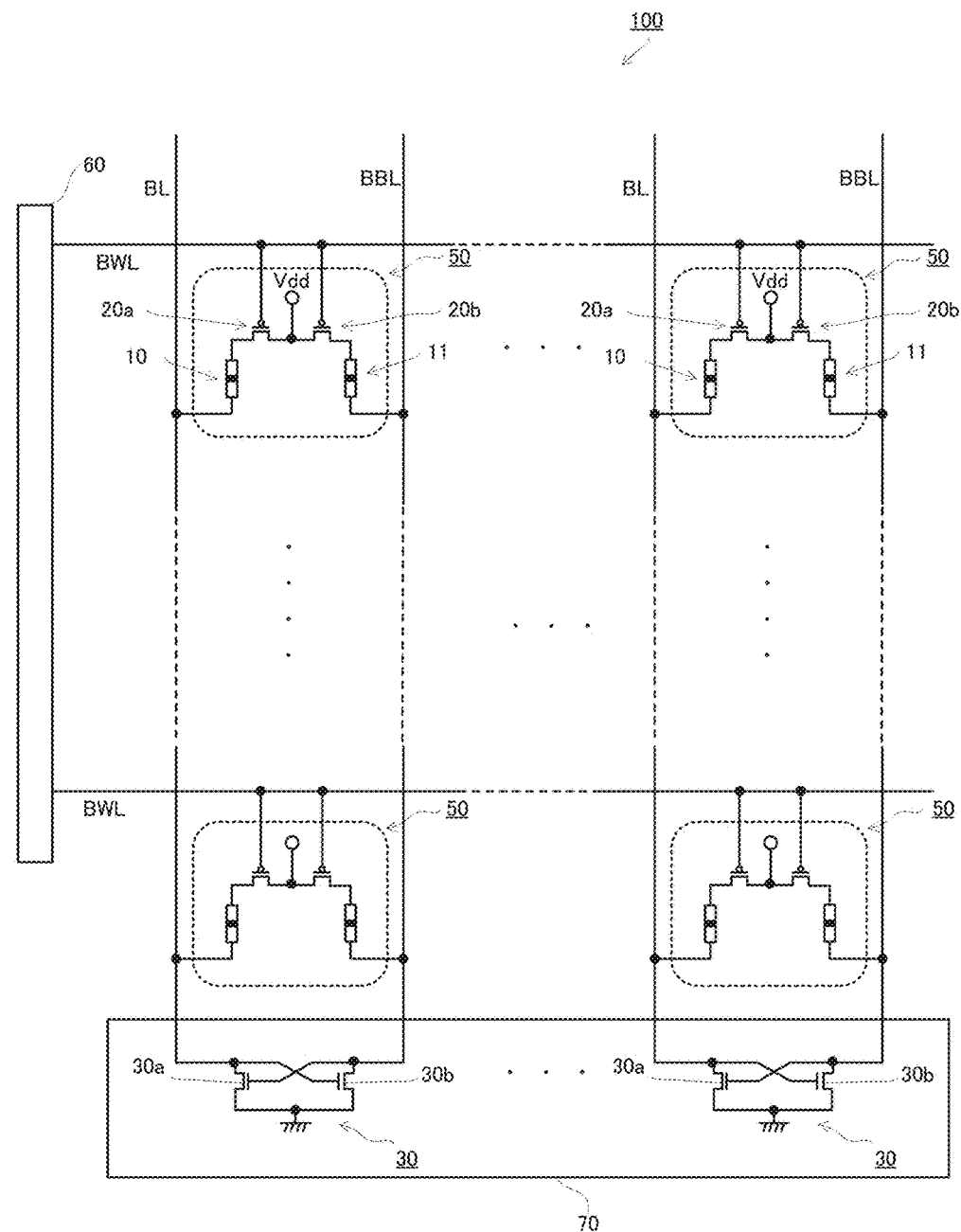
FIG. 1 is a drawing showing a configuration of a memory circuit according to a first exemplary embodiment of the present disclosure.

A memory circuit 100 according to a first exemplary embodiment of the present disclosure includes, as shown in FIG. 1, a plurality of memory cells 50 arranged in a matrix, a row decoder 60 and a sense amplifier 70.

Memory cells 50 in the same row are connected to the row decoder 60 via the same word line bar BWL. In addition, memory cells 50 in the same column are connected to the sense amplifier 70 via the same bit line BL and bit line bar BBL.

The row decoder 60 decodes a row address, and selects a memory cell 50 by changing the voltage of the word line bar BWL to a low level (selection signal). The sense amplifier 70 is equipped with a sense circuit 30 for each bit line BL and bit line bar BBL pair. At the time of read-out, the sense amplifier 70 amplifies the voltage relationship between the bit line BL and the bit line bar BBL by means of the sense circuit 30, and data is read out from the memory cell 50.

Figure 2:
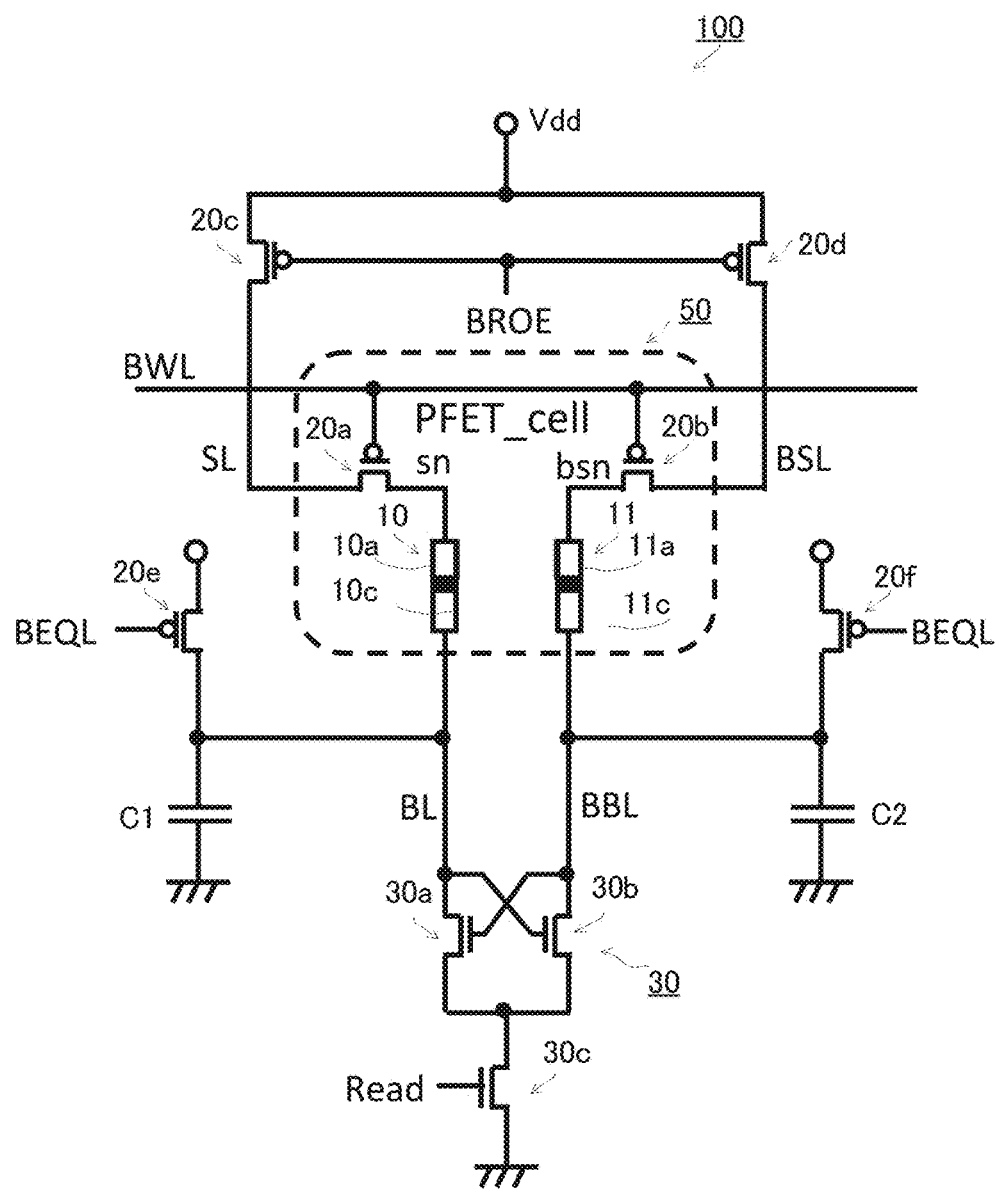
FIG. 2 is a drawing showing a detailed circuit configuration of a sense circuit and a memory cell of a memory circuit according to the first exemplary embodiment.

FIG. 2 shows a circuit diagram in which only one memory cell 50 and sense circuit 30 have been extracted from the constituent elements of the memory circuit 100 shown in FIG. 1.

As shown in the drawing, the memory cell 50 includes two magnetic tunneling junction (MTJ) elements (hereafter referred to as MTJs) 10 and MTJ 11, and two p-type MOSFETs (hereafter referred to as PFETs) 20a and 20b that are selection transistors for the MTJ 10 and the MTJ 11.

Figure 3A:
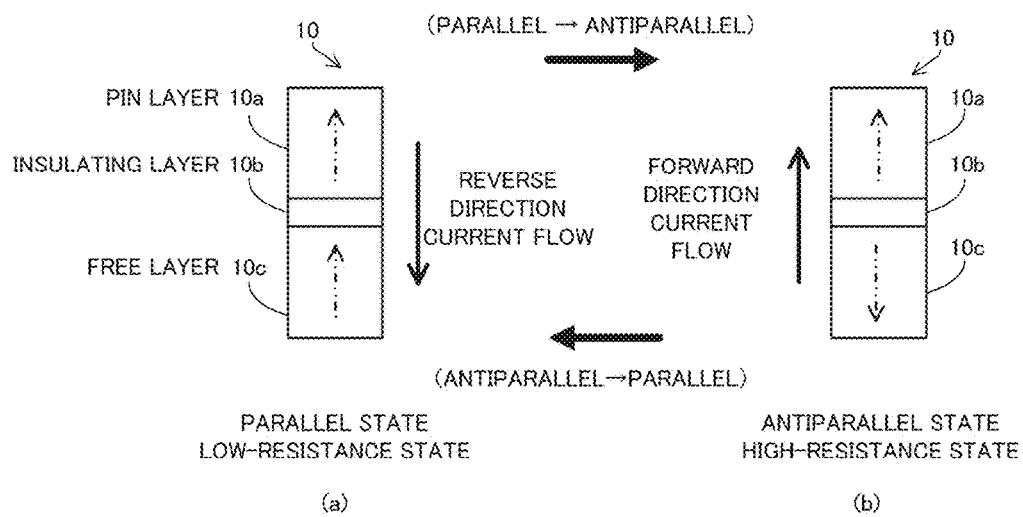
FIG. 3A is a drawing for explaining the relationship between the condition of an MTJ and resistance.

The MTJ 10 and the MTJ 11 are resistance change-type memory elements having the same properties as each other. The configuration of the MTJ 10 and the MTJ 11 will be described taking MTJ 10 as an example. As shown in FIG. 3A, the MTJ 10 includes three layers, namely a pin layer 10a, an insulating layer 10b, a free layer 10c. FIG. 3A(a) shows the MTJ 10 in a parallel state in which the magnetic orientations of the pin layer 10a and the free layer 10c indicated by arrows are uniform. In the parallel state, the resistance of the MTJ 10 becomes smaller. This parallel state is also called a low-resistance state. On the other hand, FIG. 3A(b) shows the MTJ 10 in an antiparallel state in which the magnetic orientations of the pin layer 10a and the free layer 10c are not uniform. In the antiparallel state, the resistance of the MTJ 10 becomes larger. This antiparallel state is also called a high-resistance state.

Figure 3B:
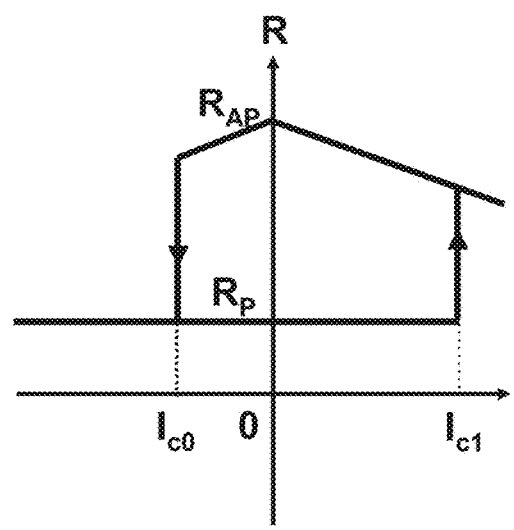
FIG. 3B is a drawing showing current-resistance properties of the MTJ.

FIG. 3B shows current-resistance properties of the MTJ 10. Here, the vertical axis shows a resistance R of the MTJ 10, and the horizontal axis shows a current I flowing in the MTJ 10. As shown in the drawing, when a forward current Ic1 flows in the MTJ 10, the MTJ 10 becomes in the antiparallel state and the resistance value increases. On the other hand, when a reverse current Ic0 flows in the MTJ 10, the MTJ 10 becomes in the parallel state and the resistance value decreases. This change in resistance is called a tunneling magnetic resistance effect. The MTJ 11 has the same property.

Using this kind of property, the parallel state (low-resistance state) and the antiparallel state (high-resistance state) are respectively associated with "0" and "1". Furthermore, by causing the desired current to flow in the MTJ 10 and controlling the parallel state ("0") and the antiparallel state ("1"), storing one bit of information in memory becomes possible.

As shown in FIG. 2, the pin layers 10a and 11a of the MTJ 10 and 11 are respectively connected to the drains of the corresponding PFETs 20a and 20b. The gates of the PFETs 20a and 20b are respectively connected to the corresponding word line bar BWL. The sources of the PFETs 20a and 20b are respectively connected to the source line SL and the source line bar BSL. The PFETs 20a and 20b function as selection transistors for selecting a memory cell 50. The PFETs 20a and 20b turn on and off in response to row selection signals (row activity) input via the word line bar BWL, and switch the electric current supply to the MTJs 10 and 11 on and off.

In addition, the source line SL is connected to the drain of the PFET 20c and the source line bar BSL is connected to the drain PFET 20d. The sources of the PFETs 20c and 20d are connected to a power source terminal on which a power source voltage Vdd is impressed. The gates of the PFETs 20c and 20d are connected to a control line BROE. The PFETs 20c and 20d turn on and off in response to control signals (signals controlling the turning on and off of the power source supply) supplied via the control line BROE. In order to facilitate understanding, below there are cases in which the name of a signal line and the name of a signal transmitted on that signal line are the same.

The free layers 10c and 11c of the MTJs 10 and 11 are respectively connected to the bit line BL and the bit line bar BBL. The drains of n-type MOSFETs (hereafter referred to as NFETs) 30a and 30b comprising the sense circuit 30 are respectively connected to the bit line BL and the bit line bar BBL.

The sense circuit 30 includes the cross-connected NFETs 30a and 30b. The sources of the NFETs 30a and 30b are connected in common, and are grounded via the current path (drain-source path) of an NFET 30c. The gate of the NFET 30c is connected to a control line Read.

In addition, the drains of PFETs 20e and 20f are connected to the bit line BL and the bit line bar BBL. A control line BEQL for inputting a BEQL signal from an equalizer is connected to the gates of the PFETs 20e and 20f. The sources of the PFETs 20e and 20f are, for example, connected to a source line SL and a source line bar BSL.

In addition, the drains of the PFETs 20e and 20f are respectively connected to capacitors C1 and C2. The capacitors C1 and C2 are equivalence circuits for the distributed parasitic capacitance of the bit line BL and the bit line bar BBL. The capacitors C1 and C2 are charged by the control line BEQL when the PFETs 20e and 20f are on. Through this, the bit line BL and the bit line bar BBL are charged to virtually the power source voltage prior to memory read-out and/or the like.

Figure 4A:
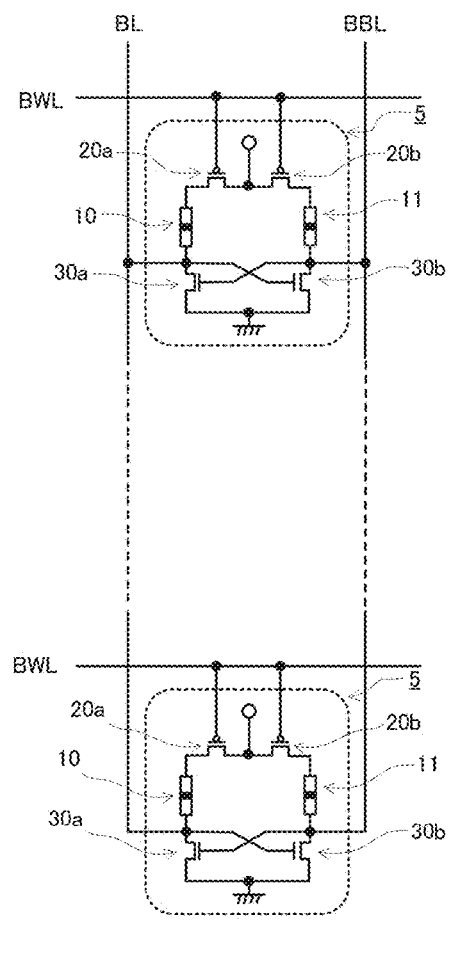
FIG. 4A is a circuit diagram of a memory circuit in which memory cells with a conventional 4T2MTJ configuration are arranged in multiple stages.
Figure 4B:
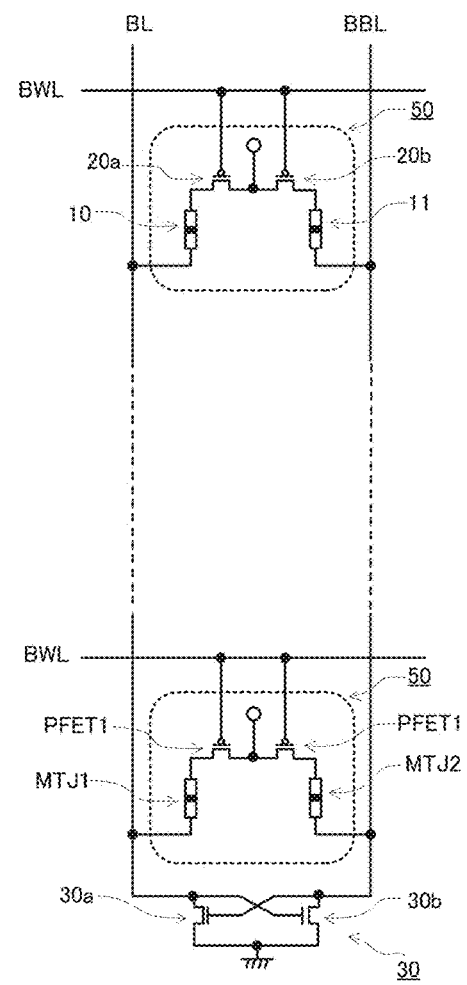
FIG. 4B is a circuit diagram of a memory circuit in which memory cells according to the exemplary embodiments are arranged in multiple stages.

Next, the sense circuit 30 is described with reference to FIGS. 4A and 4B. FIG. 4A is a drawing showing a circuit in which a plurality of memory cells 5 having a conventional 4T2MTJ configuration are connected to a bit line pair. FIG. 4B is a drawing showing a circuit in which a plurality of the memory cells 50 is connected to a bit line pair.

As shown in FIG. 4A, each conventional memory cell 5 includes the MTJ 10 and the MTJ 11, the PFET 20a and the PFET 20b for driving the MTJs, and the NFET 30a and the NFET 30b, which fill the role of a sense circuit.

On the other hand, in this exemplary embodiment, the sense circuit 30 (NFETs 30a and 30b) is shared among a plurality of the memory cells 50, as shown in FIG. 4B. That is to say, unlike the memory cell 5 shown in FIG. 4A, each memory cell 50 does not include the sense circuit 30 and includes only two MTJs 10 and 11 and two PFETs 20a and 20b. Accordingly, the area monopolized by the memory cell 50 of this exemplary embodiment can be reduced in comparison to a memory cell having a conventional 4T2MTJ configuration. Accordingly, if other conditions are the same, the size of the memory circuit 100 can be reduced.

On the other hand, when attention is given to the memory cells 50 in a row selected by the row decoder 60, the memory cells 50 and the sense circuit 30 are directly connected via the bit line BL and the bit line bar BBL and have the same configuration as the memory cells 5.

Next, operation of the memory circuit 100 having the above-described configuration will be explained with reference to FIG. 2. When data is read out from an arbitrary memory cell 50 of the memory circuit 100, the row address is supplied to the row decoder 60. The row decoder 60 sets the voltage of the word line bar BWL of the row that is the selection target to a low level. Following this, the row decoder 60 sets the control line BEQL of the column that is the selection target to a high level, and sets the control line Read to a high level.

By the control line BEQL, which originally was at a low level, going to a high level, the PFETs 20e and 20f change from on to off. Hence, the bit line BL and the bit line bar BBL, which were originally pre-charged to the power source voltage, become floating at that level.

By the voltages of the control line BROE and the word line bar BWL going to the low level, the PFETs 20a, 20b, 20c and 20d turn on. Accordingly, current flows from the power source Vdd to the bit line BL via the PFETs 20c and 20a and the MTJ 10, and current flows from the power source Vdd to the bit line bar BBL via the PFETs 20d and 20b and the MTJ 11. A difference in the magnitude of the electric current arises through the resistance values of the MTJ 10 and the MTJ 11. Through this difference, a difference in the voltages of the bit line BL and the bit line bar BBL arises, and this difference is amplified by the sense circuit 30.

In this manner, voltages corresponding to the resistances of the MTJ 10 and the MTJ 11 appear in the bit line BL and the bit line bar BBL, and the memory data is read out.

The circuits of FIG. 1 and FIG. 2 show only the necessary circuits when data is read out from the memory cell 50. Times when data is written to the memory cell 50 will be described later using FIG. 13.

As described above, with the memory circuit 100 according to this exemplary embodiment, reducing the size of the memory cell 50 becomes possible while realizing the same writing operation and read-out operation of a conventional 4T2MTJ memory circuit. Furthermore, reducing the size of the memory circuit 100 as a whole becomes possible if memory capacity is kept the same.

Next, the operating properties of the memory circuit 100 having the above-described configuration will be described. First, in order to evaluate the power consumed by the memory circuit 100, the operating currents of a plurality of types of the spin transfer torque-magnetoresistive random access memory (STT-MRAM) used for comparison were found, as shown in FIG. 5A to FIG. 5C.

Figure 5A:
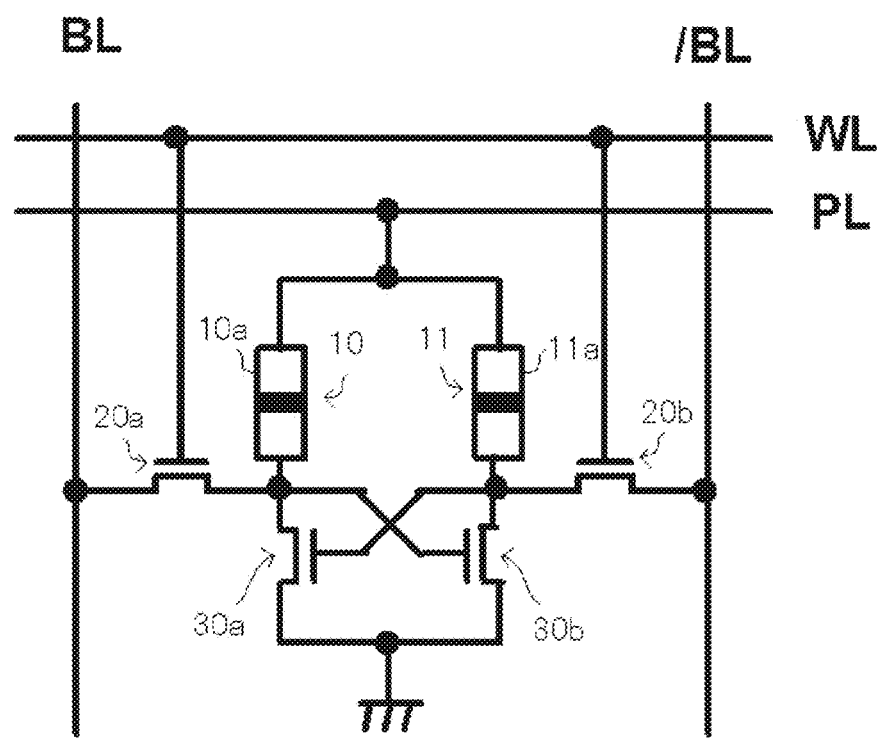
FIG. 5A is a circuit diagram of a 4T2MTJ memory cell of a comparison example.
Figure 5B:
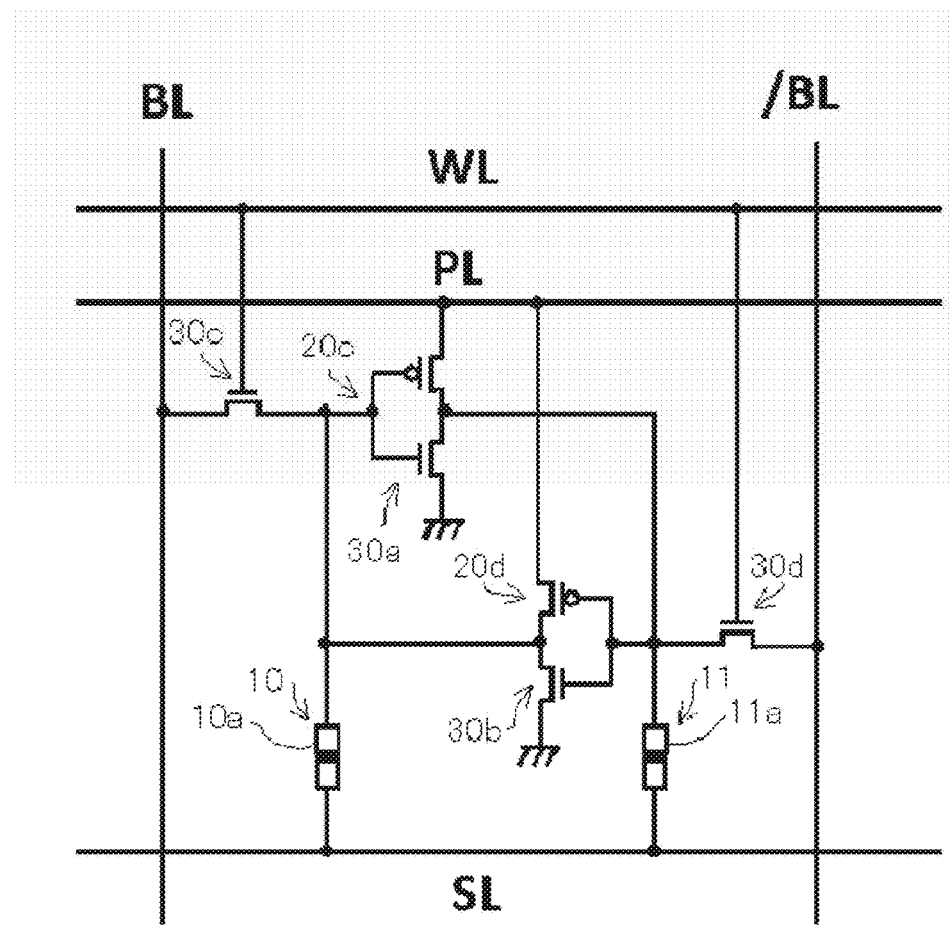
FIG. 5B is a circuit diagram of a 6T2MTJ memory cell of a comparison example.
Figure 5C:
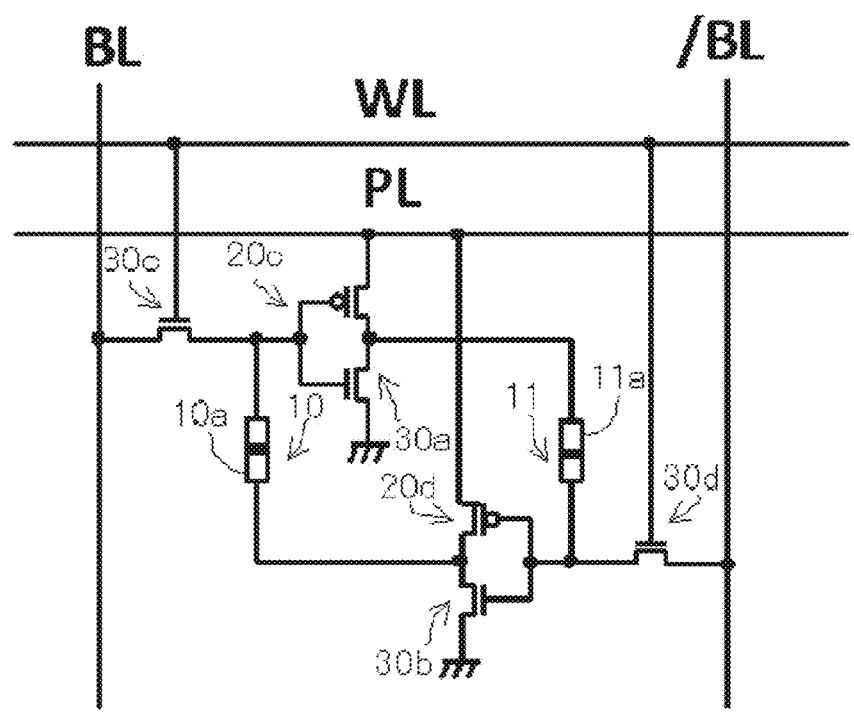
FIG. 5C is a circuit diagram of another circuit configuration of a 6T2MTJ memory cell of a comparison example.

FIG. 5A shows a memory cell with a 4T2MTJ configuration including four transistors and two MTJs. FIG. 5B shows a memory cell with a 6T2MTJ configuration (hereafter referred to as 6T2MTJ-1) including six transistors and two MTJs. FIG. 5C shows another memory cell with a 6T2MTJ configuration (hereafter referred to as 6T2MTJ-2) including six transistors and two MTJs.

In addition to this, the operating currents of a low operating power (LOP)-type static random access memory (SRAM) and a low standby power (LSTP)-type SRAM, comprising six transistors, were found under the same conditions as the above-described STT-MRAM.

One-dimensional power gating (fine power gating) in 32-bit units was respectively applied to the above-described differential pair-type STT-MRAM and two types of SRAM memory cells. One-dimensional power gating was applied for the following reason. With two-dimensional power gating (coarse power gating), the number of power line drivers is fewer, but there are performance problems in that wake-up time is slow, operating current is large and/or the like. In addition, with zero-dimension power gating, one power line driver is assigned to one memory cell, so compared to one-dimensional power gating and two-dimensional power gating, the number of power line drivers is large and the area monopolized by the circuit becomes large. Hence, from the perspective of both area overhead and performance, the decision was taken that one-dimensional power gating was the optimum power gating.

FIG. 6 shows simulation results for operating currents of the above-described memory cell 50 with a 2T2MTJ configuration, and the above-described STT-MRAM and SRAM. Here, 32 Mbyte cache memory was assumed, and operating current was found for 64-byte (256-bit) access.

The operating current for a 15-nanosecond write cycle has a simulation value of 70 mA for the 4T2MTJ shown in FIG. 5A, and this is lower than the simulation value of 121 mA for the 6T2MTJ type 1 and the simulation value of 164 mA of the 6T2MTJ type 2. On the other hand, the operating current of the 2T2MTJ cell of the present proposal is 77 mA, and while this is not a match with the 4T2MTJ, a virtually comparable low current can be realized.

In addition, the operating currents of the STT-MRAM, and the LOP- and LTSP-type SRAMs were compared. The current consumed by the LOP and LTSP SRAMs was 0.18 mA for the writing current for both, lower than the writing currents (70 mA and 63 mA) of the 2T2MTJ and the 4T2MTJ. However, SRAM requires static current for data preservation, and the operating current in the case of LOP is 1.46 A and the operating current in the case of LTSP is 138 mA, both of which are larger than the current consumption of the 4T2MTJ. Thus, from the perspective of current consumption, the 4T2MTJ configuration or the 2T2MTJ are the ideal differential pair configurations.

Figure 7:
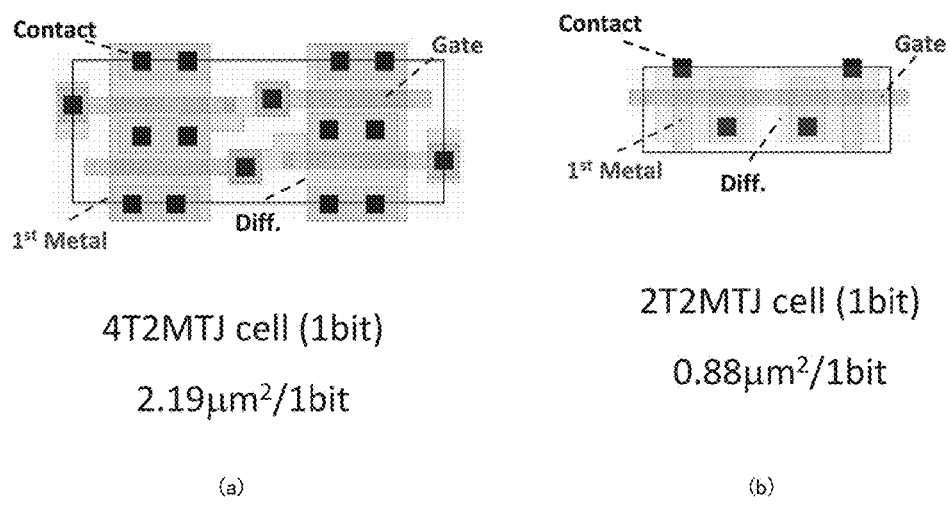
FIG. 7 is a drawing for comparing areas of memory cells, with (a) being a drawing showing a layout of a memory cell with a 4T2MTJ configuration and (b) being a drawing showing a layout of a memory cell according to the first exemplary embodiment.

Next, the results of shrinking the area of the memory cell 50 according to this exemplary embodiment were confirmed. FIG. 7(a) shows a typical layout of the memory cell 5 with the 4T2MTJ configuration. FIG. 7(b) shows a typical layout of one of the memory cells 50 according to this exemplary embodiment. Both target a one-bit memory cell in a 90 nm-generation STT-MRAM. The sizes of the MOSFETs corresponding to the PFETs 20a and 20b that are selection transistors are the same.

In the case of the 4T2MTJ configuration, the area of the memory cell was 2.19 μm², while the area of the memory cell 50 of the 2T2MTJ configuration was 0.88 μm². That is to say, in this exemplary embodiment, a one-bit cell can be configured with around 40 percent the size of area occupied by a conventional memory cell.

In this manner, the memory cell 50 according to this exemplary embodiment shares the sense circuit 30 with other memory cells 50, so that fact that area occupied by the memory cell shrinks was confirmed.

In this manner, the memory circuit 100 according to this exemplary embodiment can be reduced in size and have low power consumption.

In the configuration shown in FIG. 1, a bottom pin structure in which the pin layers of the MTJ 10 and the MTJ 11 were connected to a PFET was shown, but this is in order to avoid destructive read-out of the memory cell 50. If read-out conditions such that destructive read-out not occurring is a certainty can be realized, the pin layers 10a and 11a and the free layers 10c and 11c may also be connected in reverse.

(Variation 1)

In the memory cell 50 of the first exemplary embodiment, the MTJs 10 and 11 are connected to the bit line BL and the bit line bar BBL, and the PFETs 20a and 20b that are selection transistors are connected to the source line SL and the source line bar BSL. In contrast, a configuration would also be fine in which the pin layers 10a and 11a of the MTJs 10 and 11 are connected to the source line SL and the source line bar BSL, and the drains of the PFETs 20a and 20b are connected to the bit line BL and the bit line bar BBL, as in the memory cell 50' shown in FIG. 8. In this case, a top pin structure in which the free layers 10c and 11c of the MTJs 10 and 11 are connected to the PFETs 20a and 20b is preferable in order to prevent destructive read-out of the memory cell 50'. If read-out conditions in which destructive read-out not occurring is certain can be realized, the pin layers 10a and 11a and the free layers 11a and 11c may also be connected in reverse.

Second Exemplary Embodiment

In the first exemplary embodiment, PFETs 20a and 20b, which are p-type MOSFETs, were used as selection transistors, but n-type MOSFETs may also be used.

Figure 9:
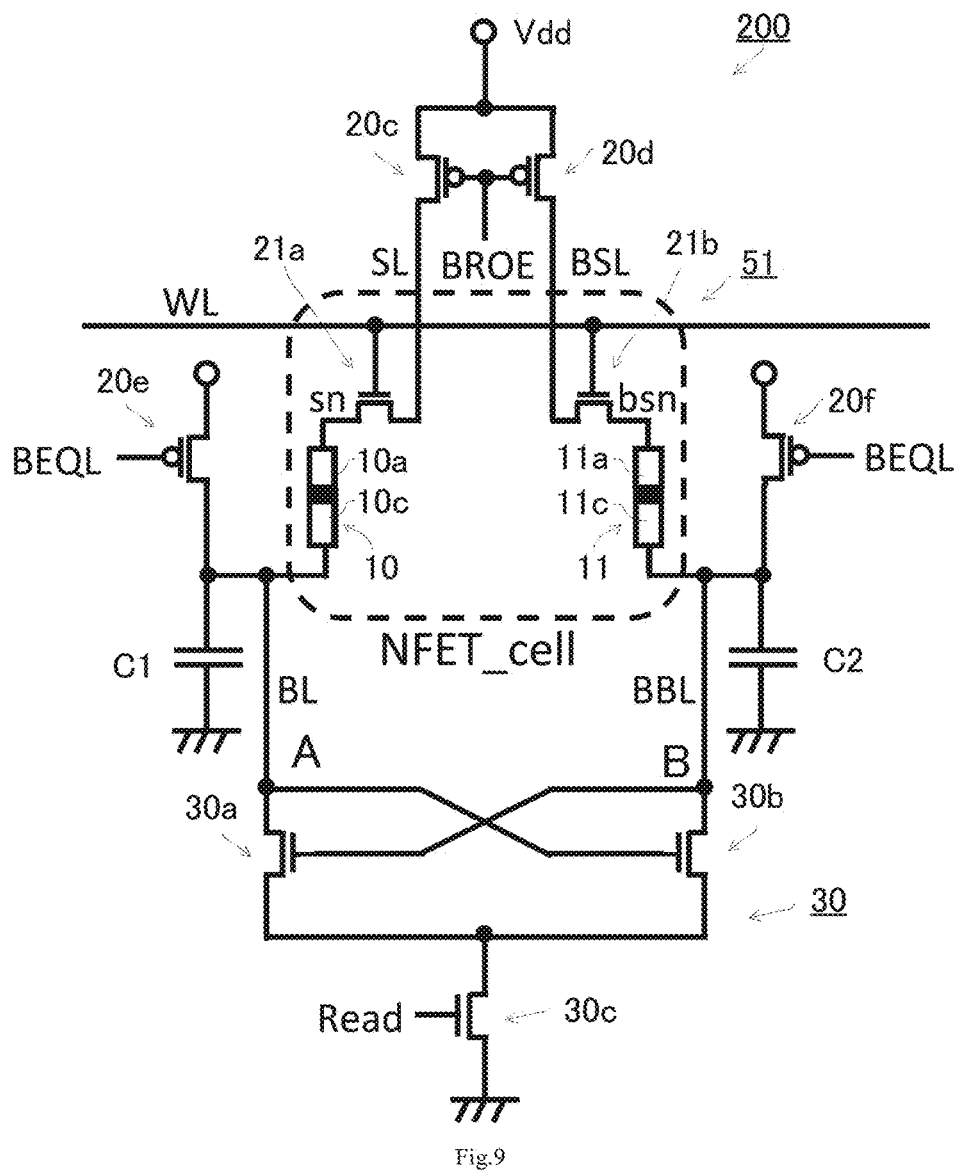
FIG. 9 is a circuit diagram of a memory circuit according to a second exemplary embodiment.

FIG. 9 shows a circuit configuration of a memory circuit 200 that uses an n-type MOSFET as a selection transistor. As shown by the one memory cell 51 and sense circuit 30 in FIG. 9, the memory circuit 200, similar to the memory circuit 100, includes a plurality of memory cells 51 and sense circuits 30 arranged in a matrix, and the sense circuit 30 is shared by a plurality of memory cells 51. Structures similar to the memory circuit 100 shown in FIG. 1 and FIG. 2 are labelled with the same reference symbols.

As shown in the drawing, the memory cell 51 includes two MTJs 10 and 11, and n-type MOSFETs NFETs 21a and 21b that are selection transistors for the MTJs.

In the memory circuit 200, the pin layers 10a and 11a of the MTJs 10 and 11 are respectively connected to the sources of the NFETs 21a and 21b. The NFETs 21a and 21b are selection transistors. The gates of the NFETs 21a and 21b are respectively connected to the word line WL. The NFETs 21a and 21b turn on and off in response to selection signals supplied via the word line WL, and switch the power source supply to the MTJs 10 and 11 on and off.

The memory circuit 200 is provided with the same configuration as the memory circuit 100 according to the above-described first exemplary embodiment other than the point that the selection transistors of the memory cell 51 are NFETs.

In the memory circuit 200, a plurality of memory cells 51 share the sense circuit 30, so the area occupied by each individual memory cell 51 can be shrunk in comparison to the memory cells of a 4T2MTJ configuration, and/or the like.

Next, the access times of the memory cell 50 (FIG. 1 and FIG. 2) of the memory circuit 100 according to the first exemplary embodiment and the memory cell 51 (FIG. 9) of the memory circuit 200 according to the second exemplary embodiment were evaluated.

Measurement of access times was accomplished as follows. In the memory circuit 100, the voltage of the word line bar BWL was changed from a high level (1 V) to a low level (0 V: active level), and the voltages of the nodes sn and bsn and of the bit line BL and the bit line bar BBL were found. With the same timing as the timing of changing the voltage of the word line bar BWL from the high level to the low level, the control line BROE is set to a low level, the control line BEQL is set to a high level, the control line Read is set to the high level, the NFETs 21a and 21b and the PFETs 20c and 20d are turned on, and the PFETs 20e and 20f are turned off. Here, the nodes sn and bsn are connection points between the pin layers 10a and 11a of the MTJs 10 and 11 and the sources of the PFETs 20a and 20b that are selection transistors.

For the memory circuit 200, the input signal of the word line WL was caused to change from the low level (0 V) to the high level (1 V), and the voltages of the nodes sn and bsn and the bit line B1 and the bit line bar BBL were measured. In the memory circuit 200 as well, a prescribed signal is input to the control line BROE, the control line BEQL and the control line Read, with the same timing as the signal input of the word line WL.

Figure 10:
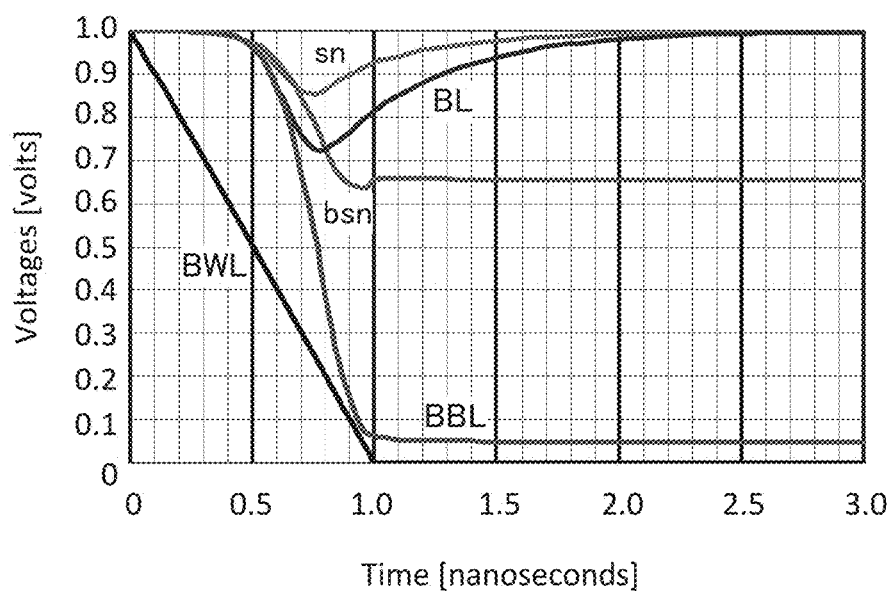
FIG. 10 is a drawing showing changes in voltage in various components at read-out from a memory cell according to the first exemplary embodiment.
Figure 11:
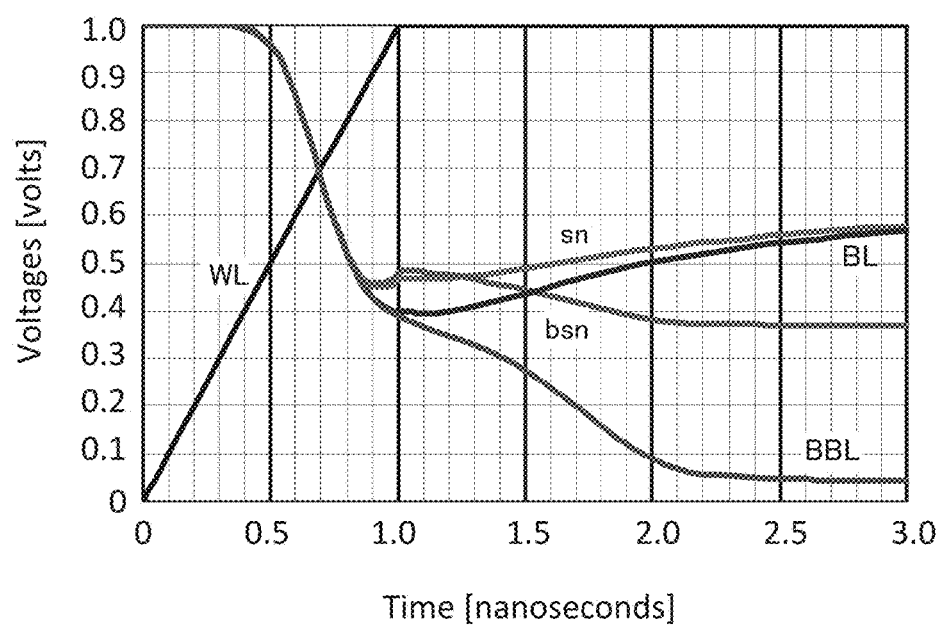
FIG. 11 is a drawing showing changes in voltage in various components at read-out from a memory cell according to the second exemplary embodiment.

FIG. 10 shows simulation results for the memory circuit 100, and FIG. 11 shows measurement results for the memory circuit 200. As shown in the drawings, the change in voltage of the bit line BL and the bit line bar BBL of the memory circuit 200 is gentler than the change in voltage of the bit line BL and the bit line bar BBL of the memory circuit 100, and furthermore, in the memory circuit 100 the bit line has a full amplitude while in the memory circuit 200 the bit line does not have a full amplitude. From these things, the fact that the read-out time of the memory circuit 100 is shorter than that of the memory circuit 200 because the bit line has a full amplitude can be understood.

Figure 12:
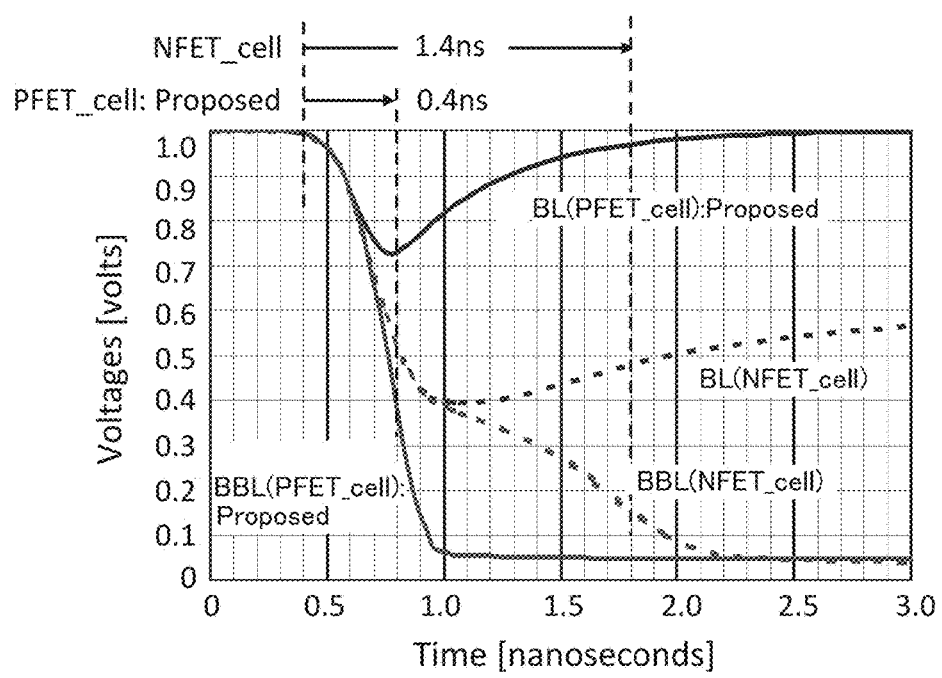
FIG. 12 is a drawing comparing changes in voltages at the bit line at read-out from a memory cell according to the first exemplary embodiment and a memory cell according to the second exemplary embodiment.

For comparison purposes, FIG. 12 shows the simulation results of the change in voltage at the time of read-out of the bit line BL and the bit line bar BBL of the memory circuit 100 along with the simulation results of the change in voltage of the bit line BL and the bit lie bar BBL of the memory circuit 200, at the time of read-out. Here, the solid lines indicate the simulation results of the memory circuit 100, and the dashed lines indicate the simulation results of the memory circuit 200.

As shown in the drawing, in the memory circuit 100, a time of around 0.4 nanosecond is needed from when the voltage of the word line bar WLB changes until the voltage difference between the bit line BL and the bit line bar BBL exceeds 0.3 V. On the other hand, in the memory circuit 200, a time of around 1.4 nanoseconds is needed from when the voltage of the of the word line WL changes until the voltage difference between the bit line BL and the bit line bar BBL exceeds 0.3 V. That is to say, the configuration of the memory circuit 100 has a shorter time for latching of the bit line, and access time is shorter.

From this, from the perspective of area occupied and the perspective of consumed power, the memory circuit 200 according to the second exemplary embodiment exhibits the same results as the memory circuit 100 according to the first exemplary embodiment. However, from the perspective of operating speed, the fact that the memory circuit 100 according to the first exemplary embodiment is superior to the memory circuit 200 was confirmed.

In order to facilitate understanding, here only the circuits needed for read-out were shown, but a configuration and operation for a memory circuit 150 as a whole including circuits necessary for writing and a decoding format in the column direction are described below. The memory cell 50 of the first exemplary embodiment is utilized as the memory cell.

Figure 13:
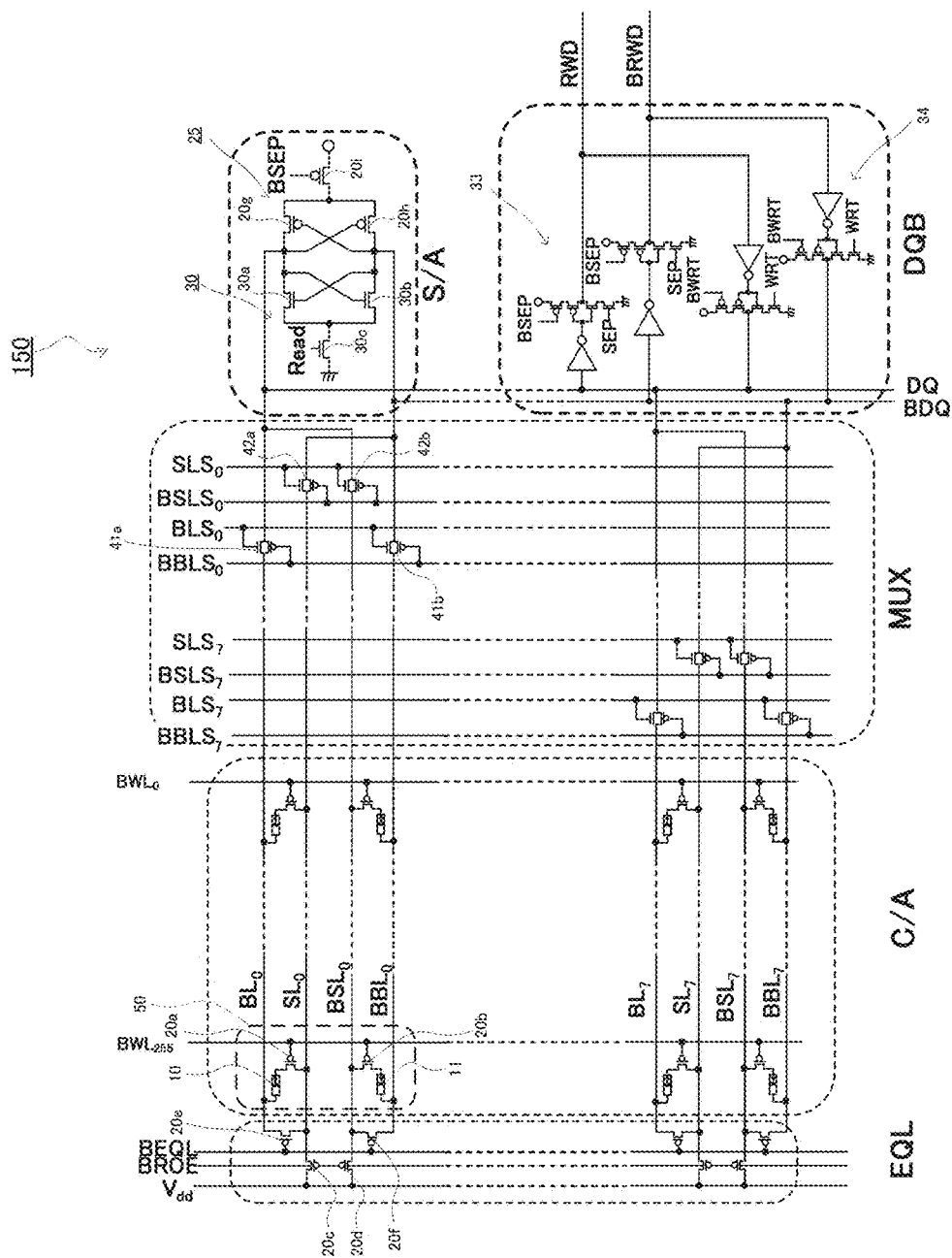
FIG. 13 is a circuit diagram of a practical example of a memory circuit using a memory cell according to the first exemplary embodiment.

As shown in FIG. 13, the memory circuit 150 includes word line bars BWL0~BWL255, bit line pairs BL0~BL7 and BBL0~BBL7, and source line pairs SL0~SL7 and BSL0~BSL7 in order to select the cell memory cell 50, the equalizer EQL and the array C/A configured from 2 k memory cells 50 arranged in 8 rows and 256 columns.

The memory circuit 150 is further equipped with a multiplexer MUX for supplying only an output signal from the selected memory cell 50 to a sense amplifier S/A, the sense amplifier S/A, and a data queue buffer DQB for reading and writing data The multiplexer MUX comprises transfer gates 41a and 41b and transfer gates 42a and 42b. The transfer gates 41a and 41b comprise CMOS in which an NFET that turns on and off through a control signal BLSi and a PFET that turns on and off through a control signal BBLSi are connected in parallel in order to connect the bit line BLi and the bit line bar BBLi pair and the sense amplifier S/A. The transfer gates 42a and 42b comprise CMOS in which an NFET that turns on and off through a control signal SLSi and a PFET that turns on and off through a control signal BSLSi are connected in parallel in order to connect the source line SLi and the bit line bar BBLi and to connect the source line bar BSLi and the bit line BLi. Here, i is an integer from 0~7.

In addition, the data queue buffer DQB is provided with an output buffer 33 that outputs data on the selected bit line BL and bit line bar BBL in response to control signals SEP and BSEP. The data queue buffer DQB is further provided with a writing buffer 34 that supplies data for writing to the bit line BL and the bit line bar BBL and the source line SL and the source line bar BSL, in response to control signals WRT and BWRT.

The equalizer EQL, multiplexer MUX, sense amplifier S/A and data queue buffer DQB are connected to an unrepresented controller, and operate in accordance with various control signals supplied from the controller.

Next, the data read-out and writing operations of the memory circuit 150 are described. Here, suppose that the memory cell 50 arranged at the position of row number 255 and column number 0 is selected. This memory cell 50 is connected to word line bar BWL255, bit line BL0, bit line bar BBL0, source line SL0 and source line bar BSL0.

When reading out data, the equalizer EQL switches the control signal BROE from high level to low level. Through this, the PFETs 20c and 20d turn on. Accordingly, the power source voltage Vdd is impressed on the source lines SL0 SL7 and the source line bars BSL0 BSL7. The equalizer EQL at the same time switches the voltage of the control line BEQL from low level to high level. Through this, the PFETs 20e and 20f turn off. Accordingly, the bit line pair BL0 and BBL0 and the source line pair SL0 and BSL0 are separated, and the bit line pair BL0 and BBL0 floats at a high level.

In addition, by the voltage of the word line bar BWL255 changing from high level to low level, the PFETs 20a and 20b turn on.

In this state, in the multiplexer MUX, a high-level selection control signal is supplied to the selected line BLS0 and a low-level selection control signal is supplied to BBLS0, so that an output signal from the selected memory cell 50 (the memory cell positioned at row 255 and column 0) is supplied to the sense amplifier S/A. Through this, the transfer gates 41a and 41b open. The SLS0 and BSLS0 remain at low level and high level, respectively, and the transfer gates 42a and 42b remain closed.

In this state, a current flows from the power source line Vdd to the bit line BL0 via the PFETs 20c and 20a and the MTJ 10. Similarly, a current flows from the power source line Vdd to the bit line bar BBL0 via the PFETs 20d and 20b and the MTJ 11. The amount of current that flows from the power source line Vdd to the bit line BL0 and the amount of current that flows from the power source line Vdd to the bit line bar BBL0 depend on the resistance values of the MTJ 10 and the MTJ 11. Consequently, a voltage difference occurs between the bit line BL0 and the bit line bar BBL0. Because the transfer gates 41a and 41b are open, the voltages of the bit line BL0 and the bit line bar BBL0 are transferred to the sense amplifier S/A.

The sense amplifier S/A amplifies the voltage difference between the bit line pair BL0 and BBL0, through the sense circuit 30.

In addition, a latch circuit 25 latches the voltage amplified by the sense circuit 30 to a signal having an amplitude between the power source voltage Vdd and the ground voltage, through a SEP bar signal BSEP impressed on the gate of the PFET 20*i* changing to low level. In addition, by switching the voltage of the word line bar BWL255 to high level and/or the voltage of the selection line BLS0 to low level, and switching the voltage of the BBLS0 to high level, with the same timing, the PFETs 20*a* and 20*b* that are selection transistors turn off and/or the transfer gates 41*a* and 41*b* close, and through this the current flowing in the MTJs 10 and 11 is stopped.

The output buffer 33 of the data queue buffer DQB outputs the signal amplified and latched by the sense amplifier S/A to the data line RWD and the data line bar BRWD, by the SEP signal SEP going to high level and the SEP bar signal BSEP going to low level.

When writing data to the memory cell 50, the BROE signal is maintained at high level. In addition, the BEQL signal transitions from low level to high level. The voltage of the word line bar BWL 255 is at low level. Through this, the PFETs 20*a* and 20*b* that are selection transistors turn on. On the other hand, the selection control signals SLS0 and BLS0 are switched to high level and the selection control signals BSLS0 and BBLS0 are switched to low level. Through this, the transfer gates 41*a*, 41*b*, 42*a* and 42*b* open. In addition, the writing control signal WRT goes to high level and BWRT goes to low level, and the writing buffer 34 starts up.

The complementary writing data RWD and BRWD are impressed on the data queue buffer DQB. When the data RWD is at high level and BRWD is at low level, a high-level signal is impressed on the bit line BL0 and the source line bar BSL0 via the writing buffer 34, and a low-level signal is impressed on the bit line bar BBL0 and the source line SL0.

Consequently, a current flows from the bit line BL0 to the free layer of the MTJ 10, to the pin layer of the MTJ 10, to the PFET 20*a* and to the source line SL0, and the MTJ 10 is switched to the parallel state (low-resistance state) or maintains the parallel state. In addition a current flows from the source line bar BLS0 to the PFET 20*b*, to the pin layer of the MTJ 11, to the free layer and to the bit line bar BBL0, and the MTJ 11 is switched to the antiparallel state (high-resistance state) or maintains the antiparallel state.

In this manner, the bit line BL0 and bit line bar BBL0 connected to the pair of MTJs of the selected cell are biased so as to have the same voltage as the source line bar BSL0 and source line SL0, respectively, through the signal input from the data queue buffer DQB via the multiplexer MUX. In this manner, the pair of MTJs of the selected cell (row 1, column 1) is overwritten.

Figure 14:
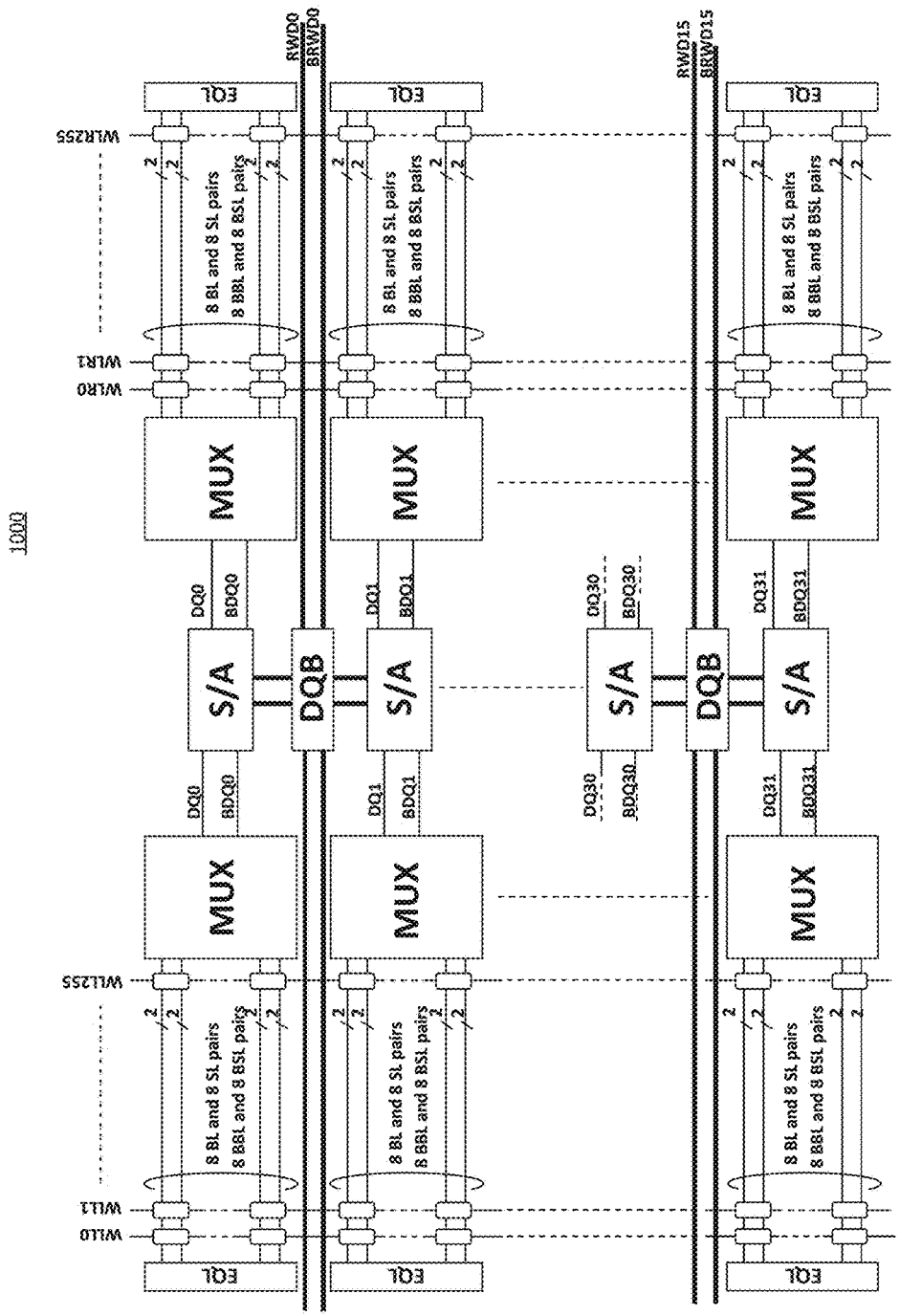
FIG. 14 is a circuit diagram of an exemplary configuration of a 128 kb memory circuit having as a basic unit the memory circuit shown in FIG. 13.

Configuring a larger-scale memory circuit with the memory circuit 150 as the basic unit is also possible. FIG. 14 shows an example of a configuration of a 128-kb memory circuit 1000 having the memory circuit 150 shown in FIG. 13 as the basic unit.

In the memory circuit 1000, two neighboring 2-kb cell arrays share a single sense amplifier S/A, and two sense amplifiers S/A share a single the data queue buffer DQB. In addition, data input and output are accomplished via 16 pairs of data lines (RWD and BRWD), that is to say 16 pairs of bit lines. In this memory circuit 1000, 16-bit access can be accomplished.

Figure 15:
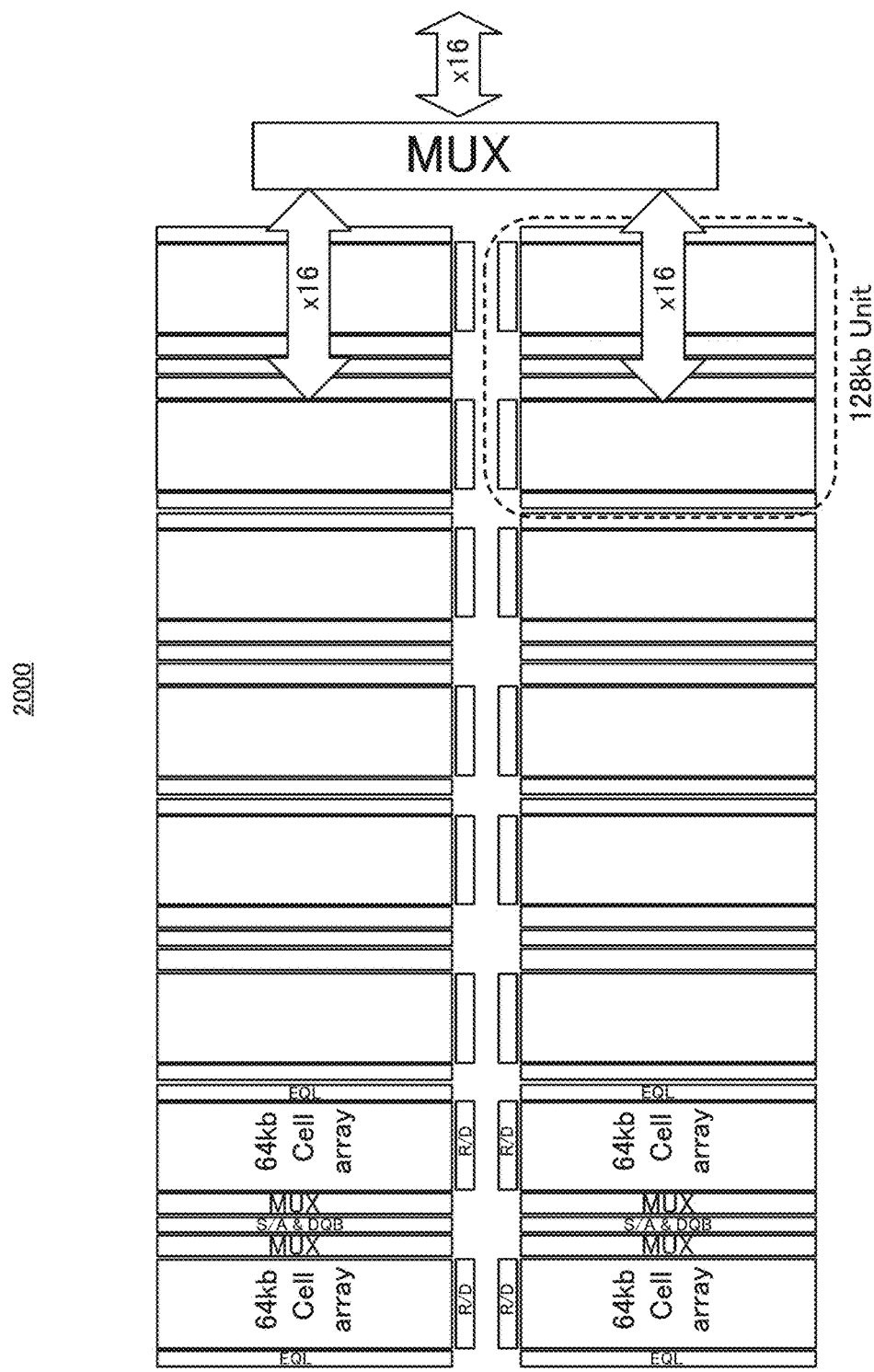
FIG. 15 is a circuit diagram of an exemplary configuration of a 1 MB memory circuit having as a basic unit the memory circuit shown in FIG. 14.

In addition, configuring a 1 Mb memory circuit 2000 is possible by assembling, as shown in FIG. 15, the 128 kb memory circuit 1000 shown in FIG. 14 as 128 k units.

This 1 Mb memory circuit 2000 has four 128 kb units respectively arranged on upper levels and lower levels. In the upper and lower of this 1 Mb memory circuit 2000, 16 pairs of data lines (bit lines) are respectively arranged, and there are 32 pairs of data lines for the cell array as a whole. These data lines are shared by the four 128 kb units of each level. That is to say, 32-bit parallel access is accomplished in the memory circuit 2000.

In addition, in the example shown in FIG. 15, the multiplexer MUX squeezes 32-bit data to 16-bit and exchanges data with the outside. However, not squeezing the data and exchanging 32-bit data with the outside would also be fine.

Figure 16:
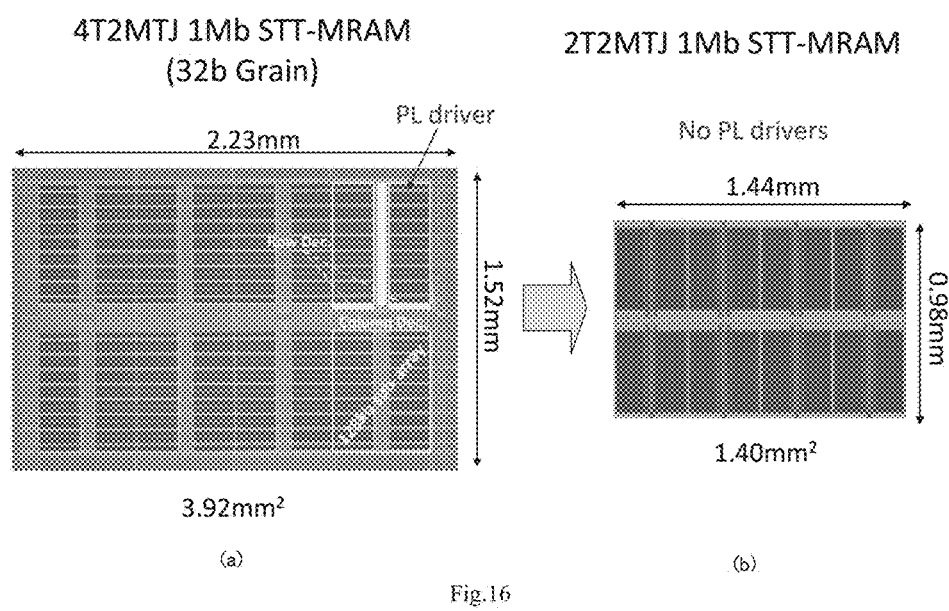
FIG. 16 is a drawing for comparing macro sizes, with (a) showing the macro size of a 1 Mb memory circuit having a 4T2MTJ configuration, and (b) showing the macro size of a 1 Mb memory circuit according to the exemplary embodiments.

FIG. 16 shows a drawing for comparing macro sizes. FIG. 16(*a*) shows a macro photograph of 1 MB in a conventional 4T2MTJ configuration, and FIG. 16(*b*) shows a macro photograph of the 1 Mb memory circuit 2000 shown in FIG. 15. These STT-MRAM are each cell arrays with cells arranged so as to have an efficient arrangement.

As shown in the drawing, taking the 1 Mb STT-MRAM that uses conventional 4T2MTJ cells as a standard, area as macro size can be shrunk by 64 percent in the 1 Mb memory circuit 2000.

This is because, as described above, sense amplifiers S/A are shared in the cells used in the 1 Mb memory circuit 2000, so the size of the monopolized area was shrunk to around 40 percent of that of a conventional 4T2MTJ cell, and in addition, the power line (PL) for 32-bit power gating used in the 4T2MTJ memory becomes unnecessary.

Next, access time in the 1 Mb memory circuit 2000 shown in FIG. 15 will be considered. Here, access time was found by conducting simulations of reading and writing data using the 1 Mb memory circuit 2000.

Figure 17:
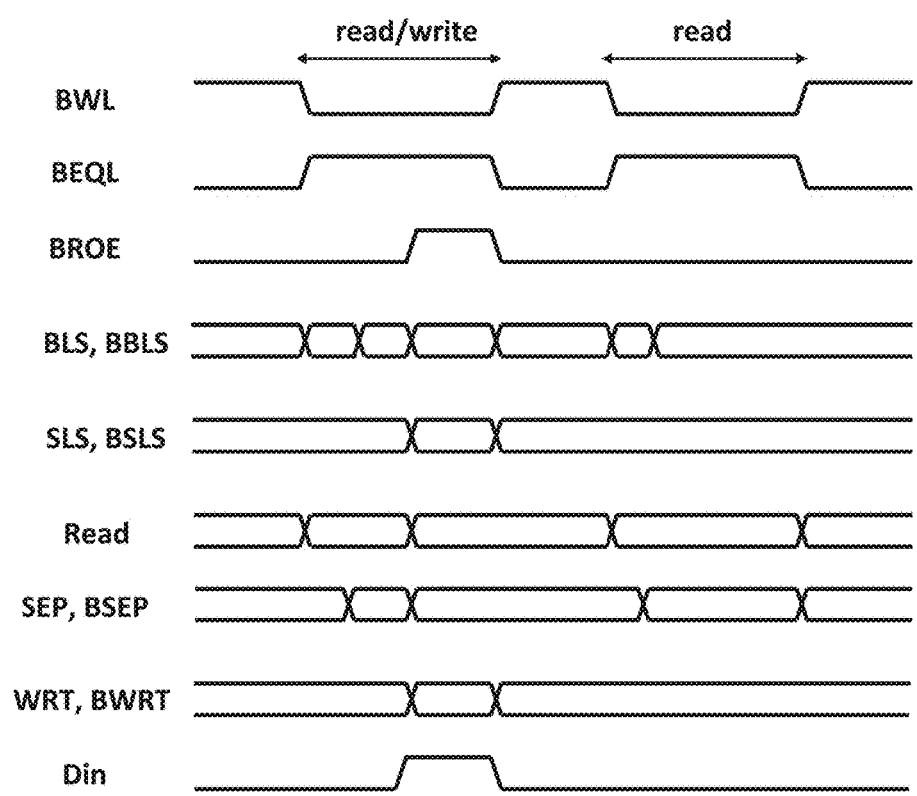
FIG. 17 is a drawing showing signals from various components in order to evaluate the performance of the 1 Mb memory circuit shown in FIG. 15.

FIG. 17 shows signal waveforms input into the 1 Mb memory circuit 2000 for simulation. In this simulation, data reading and data writing is accomplished in the first cycle, and in the next cycle, only data reading is accomplished. In addition, the power source voltage was set to 1 V.

The input signal to the word line bar BWL is set to low level when reading and writing. The control line BEQL of the equalizer EQL is set to high level when reading and writing, and the control line BROE is set to high level when writing. In addition, the control lines BLS and BBLS and the control lines SLS and BSLS of the multiplexer MUX are each controlled in accordance with the timing of reading and writing.

The control line Read of the sense amplifier S/A is such that the high/low of the input signal is switched with the timing of reading. The control lines BSEP and SEP are similarly such that the high/low of the input signal is switched with the timing of reading. On the other hand, the control line WRT and BWRT and the data input line Din are such that high/low of the input signal is switched with the timing of writing.

Figure 18:
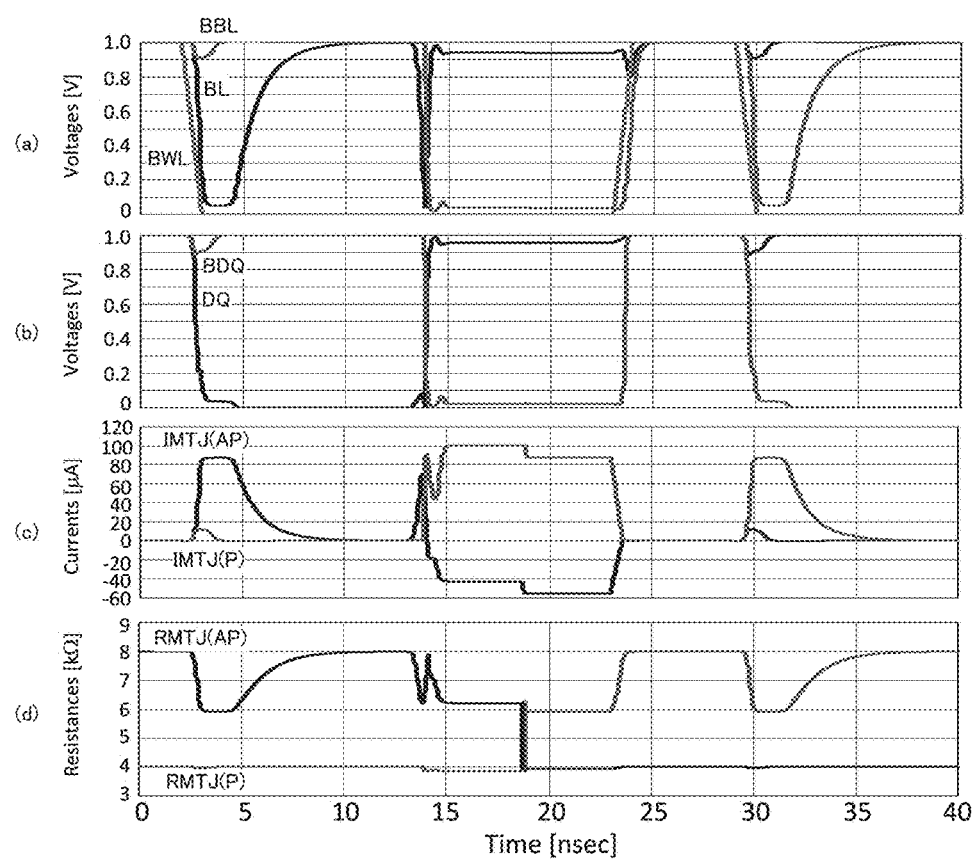
FIGS. 18(a) to 18(d) are property diagrams for evaluating the performance of the 1 Mb memory circuit shown in FIG. 15.

FIG. 18(*a*) shows the change in the voltages of the word line bar BWL, the bit line BL and the bit line bar BBL. The voltage of the word line bar BWL is 0 V from 3 nanoseconds to around 23 nanoseconds, so data reading and data writing are accomplished during this interval. In addition, from around 30 nanoseconds on, the voltage of the word line bar BWL again becomes 0 V, and data reading is accomplished in this interval. In addition, FIG. 18B shows the change in the voltages of the control lines DQ and BDQ in order to exchange data between the data queue buffer DQB and cells.

In addition, FIG. 18(c) shows the current flowing in the pair of MTJs of the selected cell, and FIG. 18(d) shows the resistance values of the pair of MTJs of the selected cell. As shown in FIG. 18(d), at around 18 nanoseconds, the resistance value of the MTJ in the antiparallel (AP) state at the time the simulation is started becomes low, and the resistance value of the MTJ in the parallel (P) state becomes high, and the values of the two are reversed. That is to say, the fact that writing was completed at this point in time can be understood.

Figure 19:
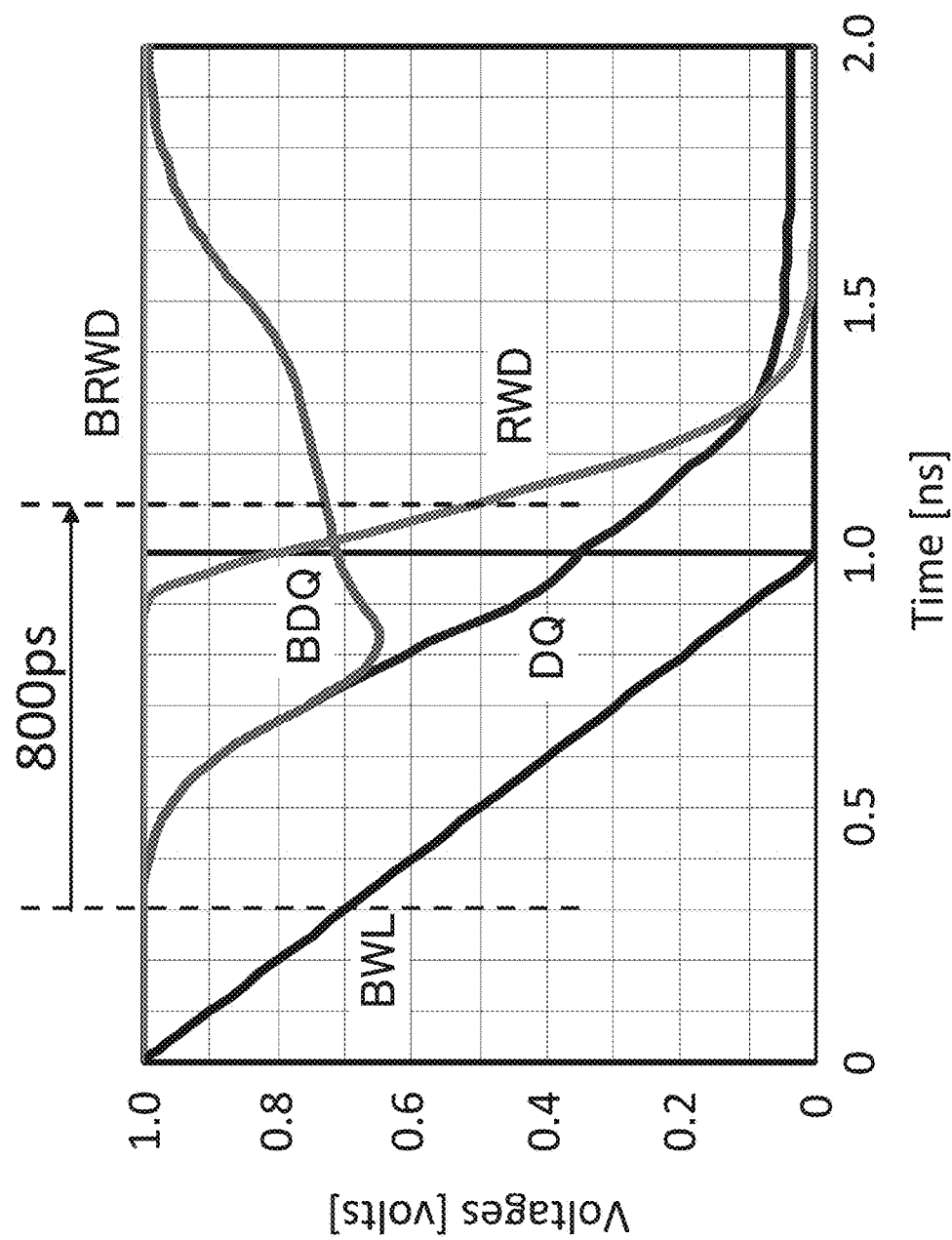
FIG. 19 is a drawing showing changes in voltage in various components at read-out from the 1 Mb memory circuit shown in FIG. 15.

In addition, FIG. 19 shows results of measuring the access time. The time from when a signal was input from the word line bar BWL until the voltage difference of the signals detected by the data lines BRWD and RWD became 0.3 V was 800 picoseconds. This access speed is a sufficient value for application to three-dimensional cache and/or the like.

Next, the configuration of the sense amplifier of the memory circuit 100 according to the first exemplary embodiment shown in FIG. 1 (hereafter referred to as the sense amplifier of this proposal) is described with regard to points having superior results compared to a conventional sense amplifier.

Figure 20:
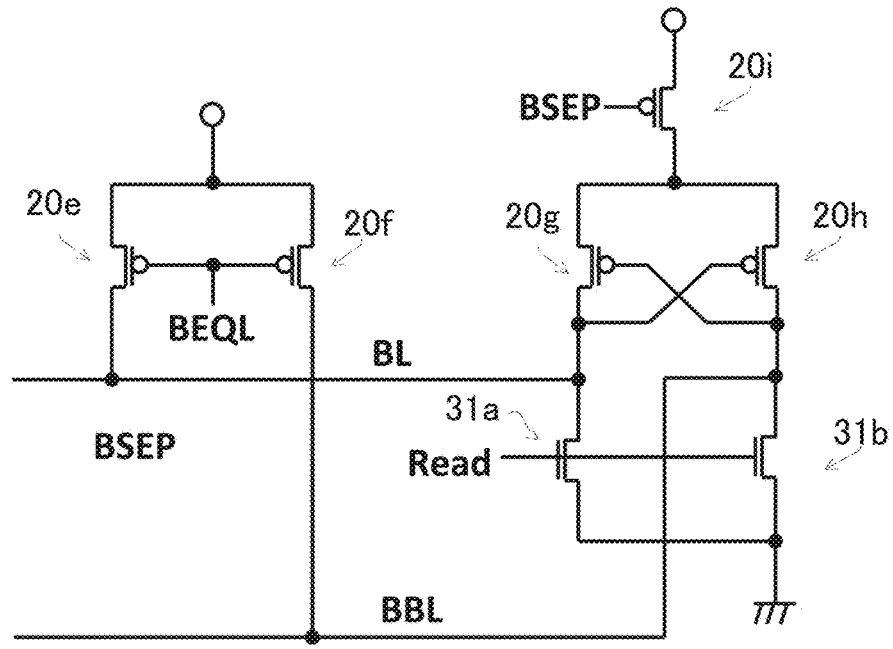
FIG. 20 is a drawing showing a circuit configuration of a conventional sense amplifier.
Figure 21:
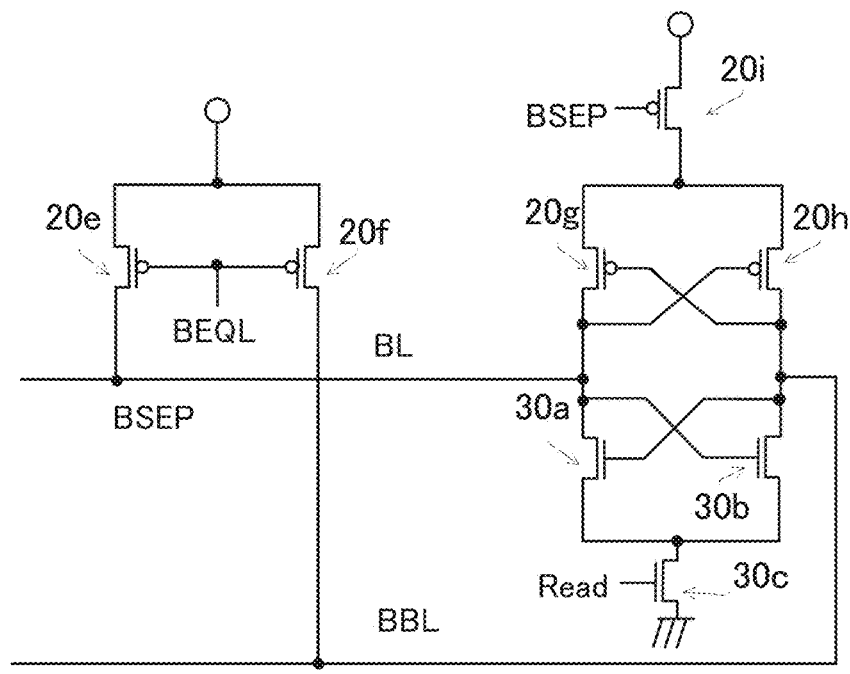
FIG. 21 is a drawing showing a circuit configuration of a sense amplifier of this proposed.

FIG. 20 shows the circuit configuration of a conventional sense amplifier. In addition, FIG. 21 shows the circuit configuration of the sense amplifier S/A of this proposal. Each of these sense amplifiers was used as the sense amplifier of the memory circuit 100 shown in FIG. 1, and the current flowing in the MTJs 10 and 11 at the time of read-out was measured.

For the sense amplifier of this proposal, the MOSFETs comprising the sense amplifier were n-type, and p-type MOSFETs (20a and 20b in FIG. 1) of differing conduction type from the MOSFETs of the sense amplifier were used in the selection transistors of the memory cells.

Figure 22:
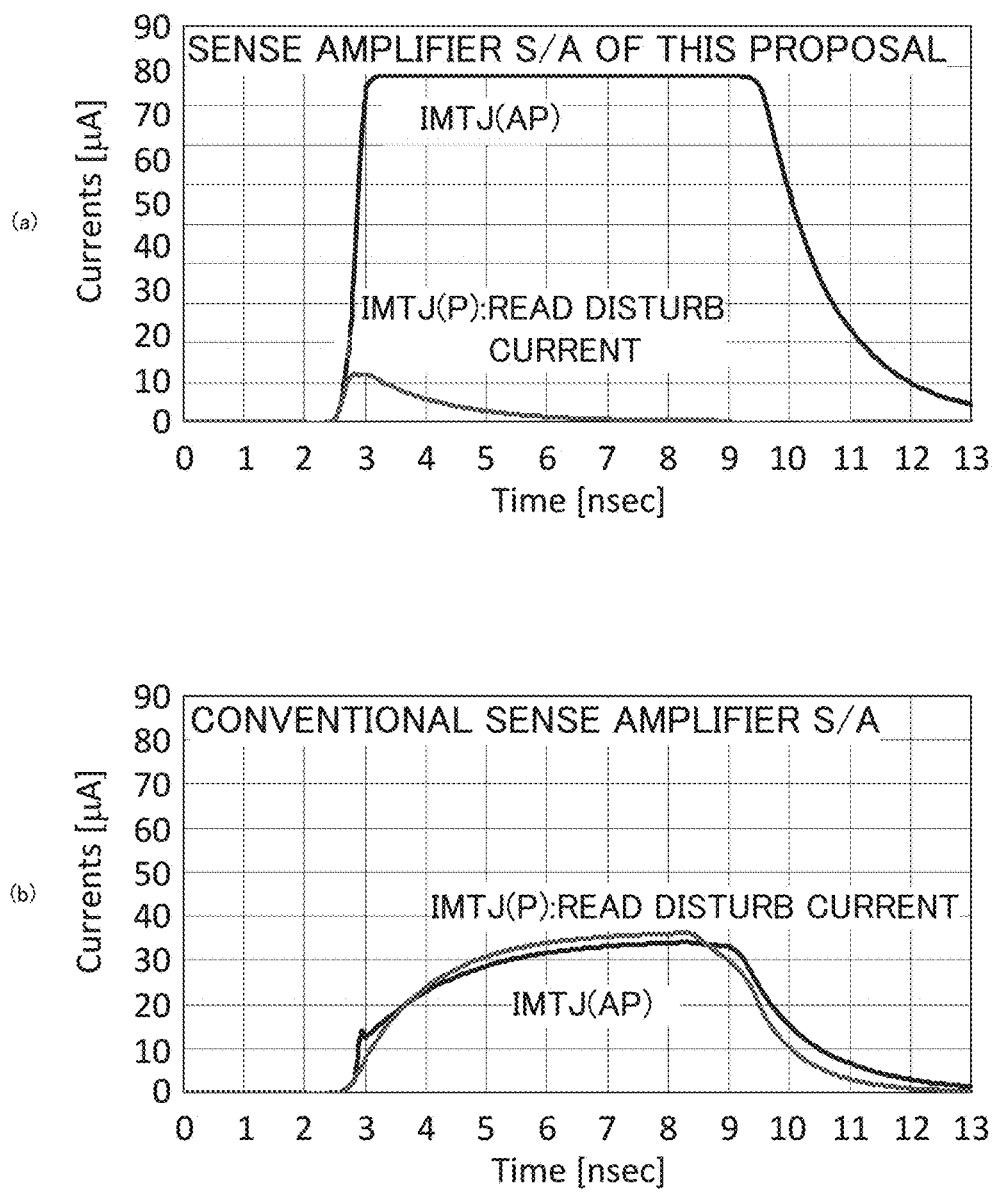
FIG. 22 is a drawing for explaining the efficacy when a sense amplifier having this proposed format is utilized, with (a) being a drawing showing the change with time in MTJ passed current at the time of read-out when a sense amplifier of this proposed format is used, and (b) being the measured results of the MTJ passed current at the time of read-out when the conventional sense amplifier shown in FIG. 20 is used.

FIG. 22(a) shows simulation results when the sense amplifier of this proposal was used. FIG. 22(b) shows simulation results when the conventional sense amplifier shown in FIG. 20 was used. Here, IMTJ (P) indicates the current flowing in the MTJ in the parallel state (low-resistance state), and IMTJ (AP) indicates the current flowing in the other MTJ in the antiparallel state (high-resistance state).

The value of IMTJ (P) shown in FIG. 22(a) is held sufficiently low in comparison to the value of IMTJ (P) shown in FIG. 22(b). That is to say, when the sense amplifier of this proposal is used, controlling the read disturb current becomes possible. This is because the sense amplifier of this proposal is configured with the NFETs cross-connected, so the input voltage is fed back.

Hence, when the configuration of the sense amplifier of this proposal was used, suppressing chip failure rate caused by read disturbance became possible.

Figure 23:
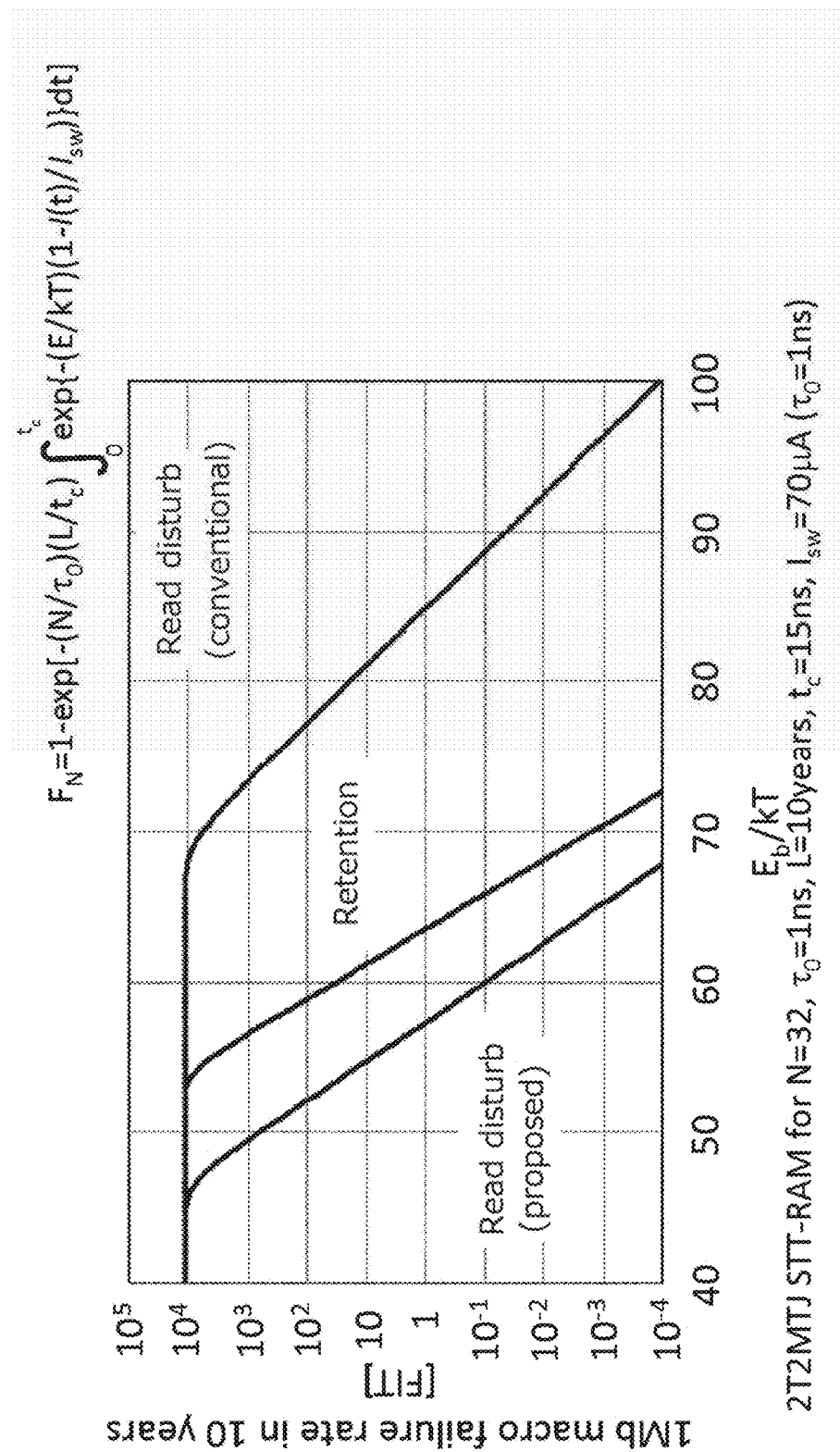
FIG. 23 is a drawing showing the failure rate of a 1 Mb memory circuit according to the first exemplary embodiment.

FIG. 23 shows the failure rate when using for 10 years a 1 Mb chip equipped with the conventional sense amplifier shown in FIG. 20 and the sense amplifier of this proposal shown in FIG. 21. The chip failure rate caused by retention is shown at the same time for comparison.

The chip failure rate of the memory circuit that uses the conventional sense amplifier is larger than that caused by retention, while in contrast, the chip failure rate of the memory circuit using the sense amplifier of this proposal is smaller than that caused by retention.

Taking 1FIT (one failure in $10^9$ hours) as a standard, when a conventional sense amplifier was used, the energy barrier/thermal energy ($E_b$/kT) in a non-volatile memory state needs to be 85 or higher, making design for thermal stability of the MTJ difficult. On the other hand, in a memory circuit using the sense amplifier of this proposal, the energy barrier/thermal energy ($E_b$/kT) of around 65 determined by retention is fine. Consequently, designing a stable memory circuit is possible even with existing MTJ technology.

As indicated by the above-described first exemplary embodiment and/or the like, by sharing the sense amplifier among a plurality of memory cells, shrinking the area occupied by each of the memory cells becomes possible. In addition, even when the area occupied by the cell was shrunk, the read-out speed was sufficiently fast to be useable in cache. Furthermore, by combining this 2T2MTJ cell and the sense amplifier of this proposal that uses a MOSFET with a different conduction type from the MOSFET that is the selection device of the 2T2MTJ cell, a sizeable reduction in disturbance current becomes possible.

CONCLUSION

Figure 24A:
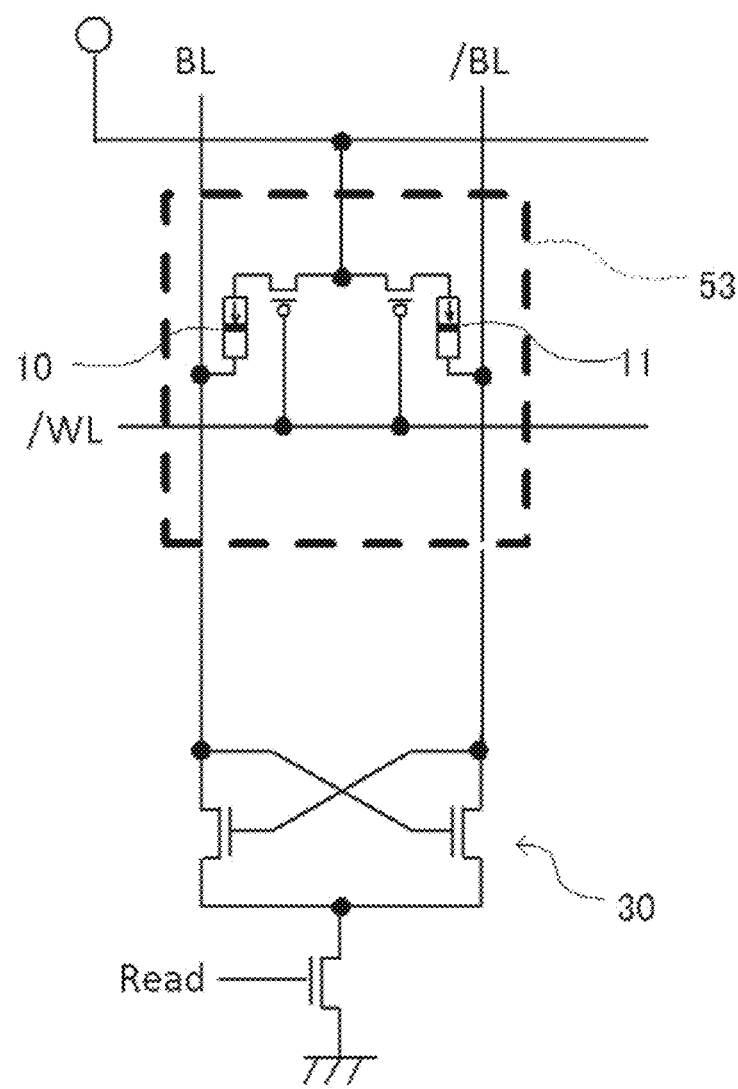
FIG. 24A is a circuit diagram of an exemplary configuration preferable in a memory circuit according to the first exemplary embodiment.

As described above, the configuration of the first exemplary embodiment reproduced in FIG. 24A is the optimal configuration when premised on a bottom pin structure. With this configuration, there is no data destruction during read-out using an easy-to-create bottom pin MTJ, the amplitude of fluctuation in the voltage of the bit line BL and the bit line bar is large, and high-speed access becomes possible. In addition, this configuration has the characteristic that securing large writing current is possible because the selection circuit is a PFET. In this manner, the conduction type of the MOSFETs comprising the sense amplifier 30 and the conduction type of the selection transistors preferably differ.

Figure 24B:
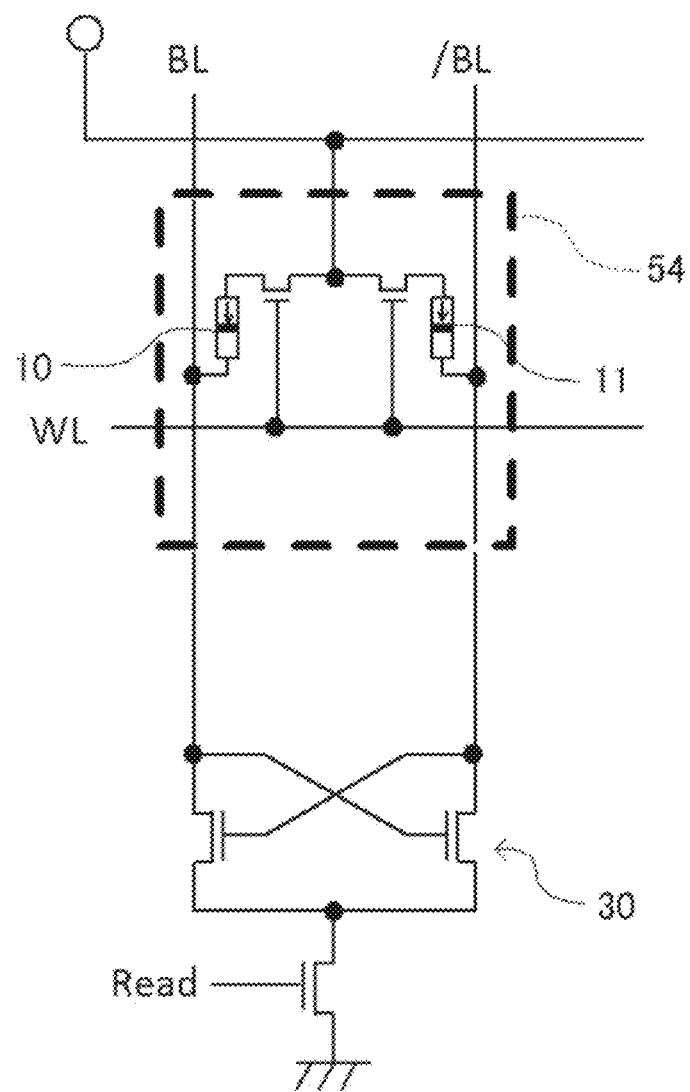
FIG. 24B is a circuit diagram of another exemplary configuration preferable in a memory circuit according to the first exemplary embodiment.

On the other hand, the configuration reproduced in FIG. 24B is substantially the same as the configuration shown in FIG. 9, and here the conduction type of the selection transistors and the conduction type of the MOSFETs comprising the sense amplifier 30 are the same. This configuration has properties comparable to the configuration of the first exemplary embodiment excluding the point that operating speed is slow.

The configuration described above is a configuration in which the memory cells are arranged on the power source side and the sense amplifier 30 is arranged on the ground side. The present disclosure is not limited to this, for as shown in FIGS. 24C and 24D, configurations in which memory cells 50' and 51' are arranged on the ground side and a sense amplifier 30' is arranged on the power source side are also possible.

Figure 24C:
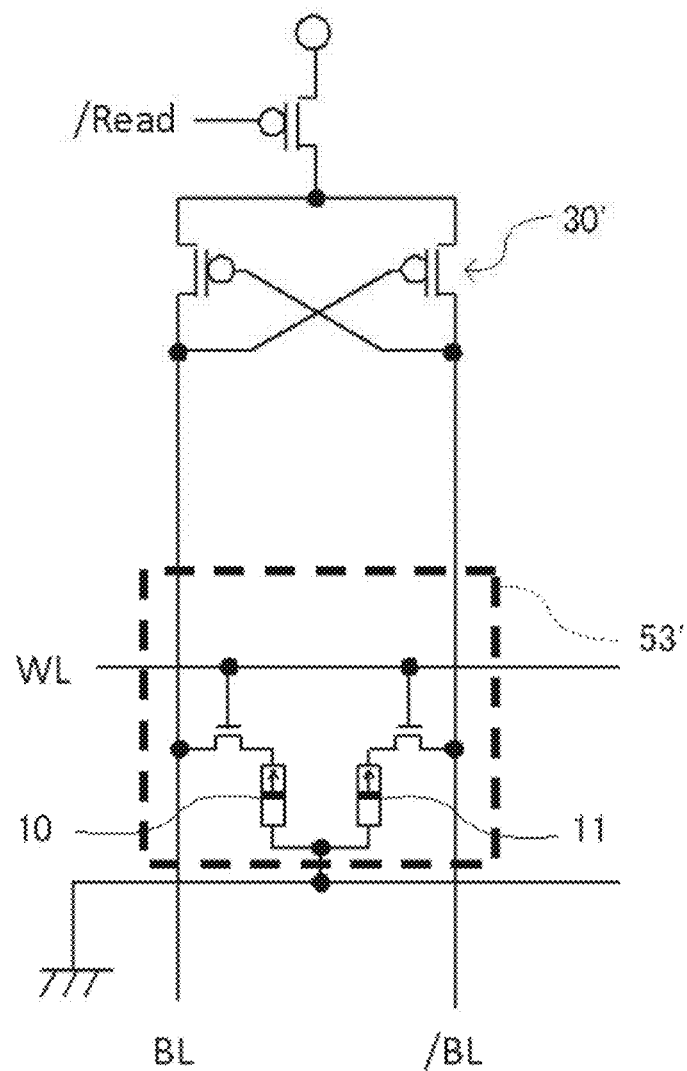
FIG. 24C is a circuit diagram of an exemplary variation of the memory circuit according to the first exemplary embodiment.

The configuration of FIG. 24C corresponds to the configuration of FIG. 24A. Here, a selection transistor comprising a memory cell 53' is an NFET, and a sense amplifier 30' is comprised of PFETs. The gate of the selection transistor is connected to the word line WL, one end of the current path of the selection transistor is connected to the bit line BL or /BL, and the other end of the current path is connected to the pin layers of the MTJ 10 and the MTJ 11. The free layers of the MTJ 10 and the MTJ 11 are grounded.

Figure 24D:
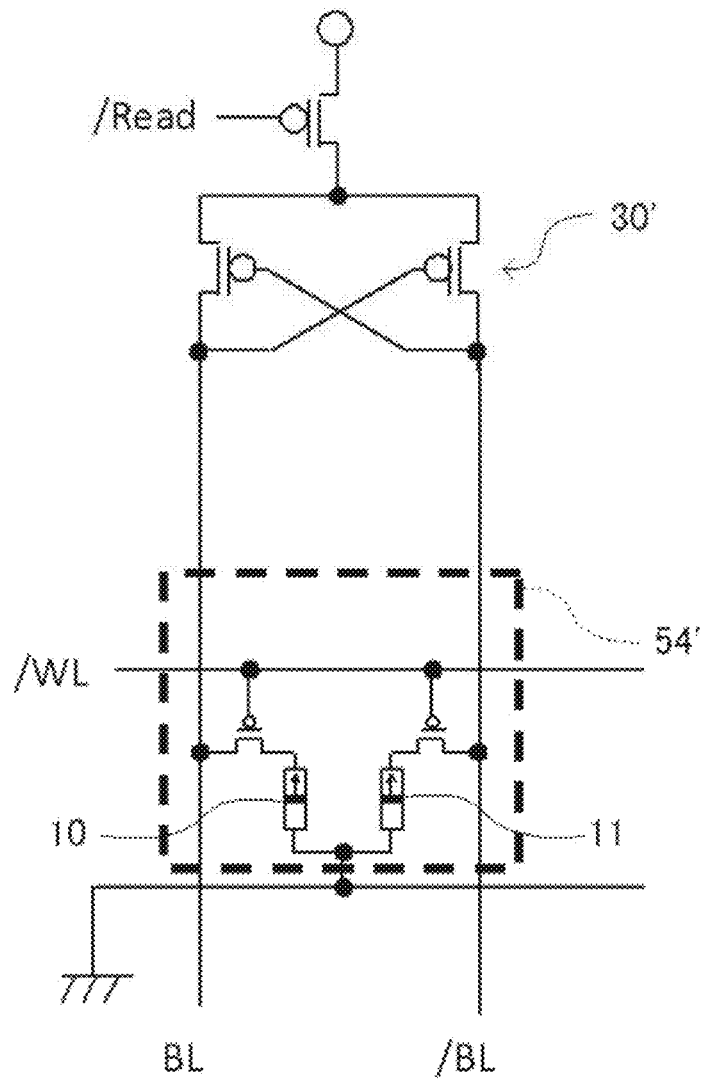
FIG. 24D is a circuit diagram of another exemplary variation of the memory circuit according to the first exemplary embodiment.

The configuration of FIG. 24D corresponds to the configuration of FIG. 24B. Here, the selection transistor is a PFET, and the sense amplifier 30' is comprised of PFETs. The gate of the selection transistor is connected to the word line /WL. One end of the current path of the selection transistor is connected to the bit line BL or /BL, and the other end of the current path is connected to the pin layers of the MTJ 10 and the MTJ 11. The free layers of the MTJ 10 and the MTJ 11 are grounded.

Even the configurations shown in FIG. 24C and FIG. 24D can utilize easily created bottom pin MTJs so there is no data destruction during read-out. Furthermore, the configuration of FIG. 24C, similar to that of FIG. 24A, has a large voltage amplitude for the bit line BL and the bit line bar BBL, so high-speed access is possible. In addition, in the circuit of FIG. 24C, the selection transistor is an NFET, so current driving capacity is higher than with a PFET and cell size can be reduced.

Figure 25A:
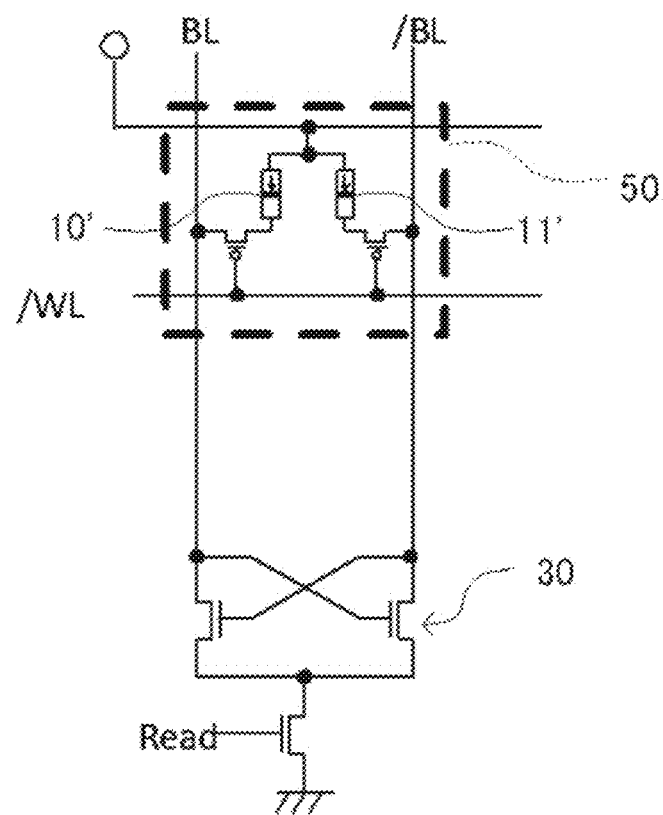
FIG. 25A is a circuit diagram of another exemplary configuration preferable in a memory circuit according to the first exemplary embodiment.

In addition, the present disclosure is not limited to examples using bottom pin MTJs, for using MTJs 10' and 11' with top pin structures is also possible. In this case, as shown in FIG. 25A a circuit using PFETs as selection transistors and NFETs as the sense circuit 30 that has no read-out data disturbance and is capable of high-speed access is an exemplary embodiment. In addition, as shown in FIG. 25B, a circuit that uses NFETs as selection transistors and PFETs as the sense circuit 30' that has no read-out data disturbance and is capable of high-speed access is an exemplary embodiment.

In the memory circuit shown in FIG. 25A, the gate of the selection transistor is connected to the word line bar /WL. One end of the current path of the selection transistor is connected to the bit line BL or /BL, and the other end of the current path is connected to the free layers of the MTJs 10' and 11'. The pin layers of the MTJs 10' and 11' are connected to the power source line.

Figure 25B:
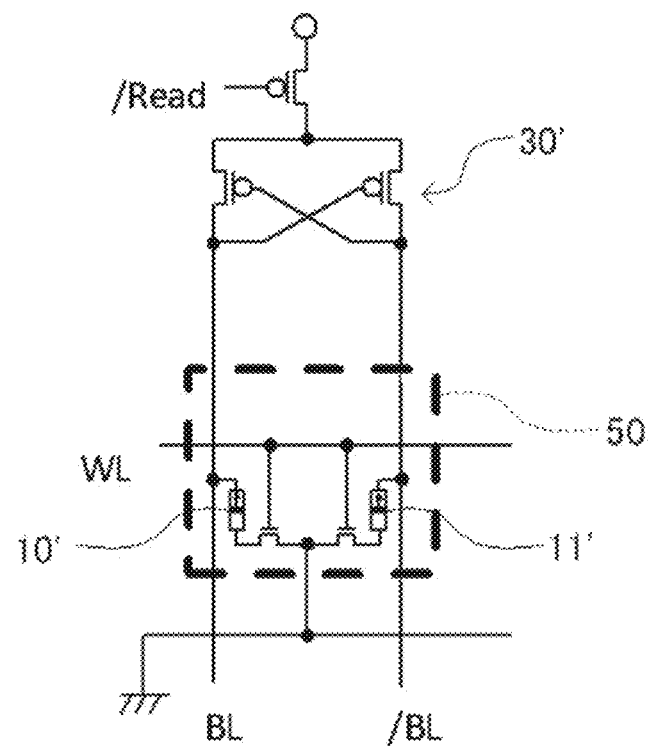
FIG. 25B is a circuit diagram of yet another exemplary configuration preferable in a memory circuit according to the first exemplary embodiment.

In the memory circuit shown in FIG. 25B, the gate of the selection transistor is connected to the word line WL. One end of the current path of the selection transistor is grounded, and the other end of the current path is connected to the free layers of the MTJs 10' and 11'. The pin layers of the MTJs 10' and 11' are connected to the bit line BL or /BL.

Figure 25C:
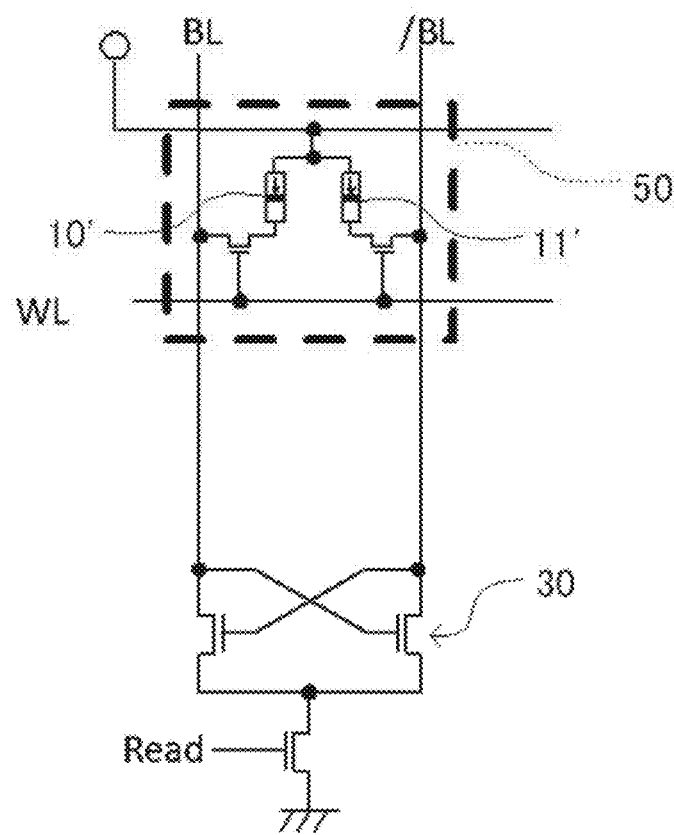
FIG. 25C is a circuit diagram of another exemplary configuration of a memory circuit according to the first exemplary embodiment.
Figure 25D:
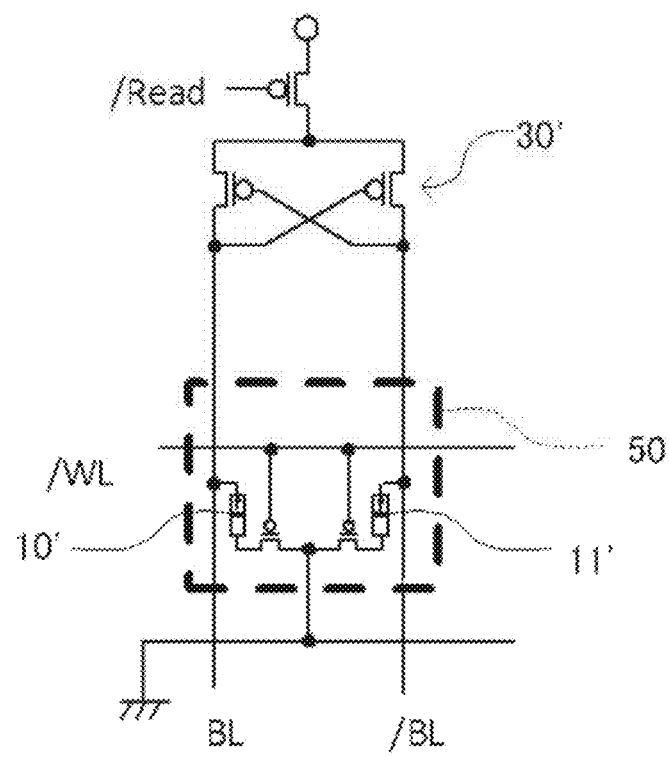
FIG. 25D is a circuit diagram of yet another exemplary configuration of a memory circuit according to the first exemplary embodiment.

Although read-out speed is slower than these, configurations such as those in FIGS. 25C and 25D can also be conceived. In the memory circuit shown in FIG. 25C, the selection transistor is an NFET and the sense circuit 30 is comprised of NFETs. The gate of the selection transistor is connected to the word line WL. One end of the current path of the selection transistor is connected to the bit line BL or /BL, and the other end of the current path is connected to the free layers of the MTJs 10' and 11'. The pin layers of the MTJs 10' and 11' are connected to the power source line.

In the memory circuit shown in FIG. 25D, the selection transistor is a PFET and the sense circuit 30' is comprised of PFETs. The gate of the selection transistor is connected to the word line bar /WL. One end of the current path of the selection transistor is grounded, and the other end of the current path is connected to the free layers of the MTJs 10' and 11'. The pin layers of the MTJs 10' and 11' are connected to the bit line BL or /BL.

Figure 8:
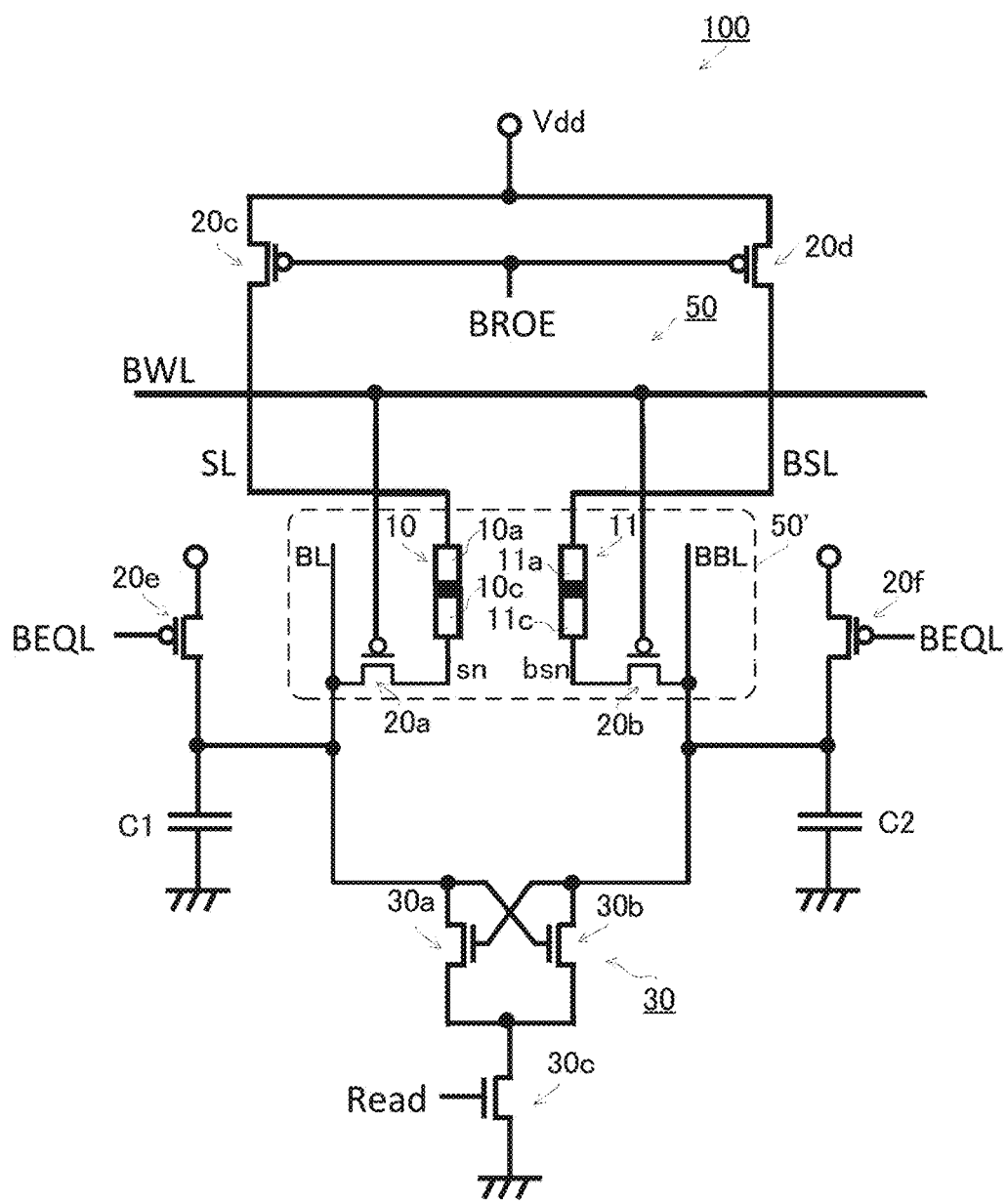
FIG. 8 is a circuit diagram of a memory circuit according to the first exemplary embodiment.
Figure 26:
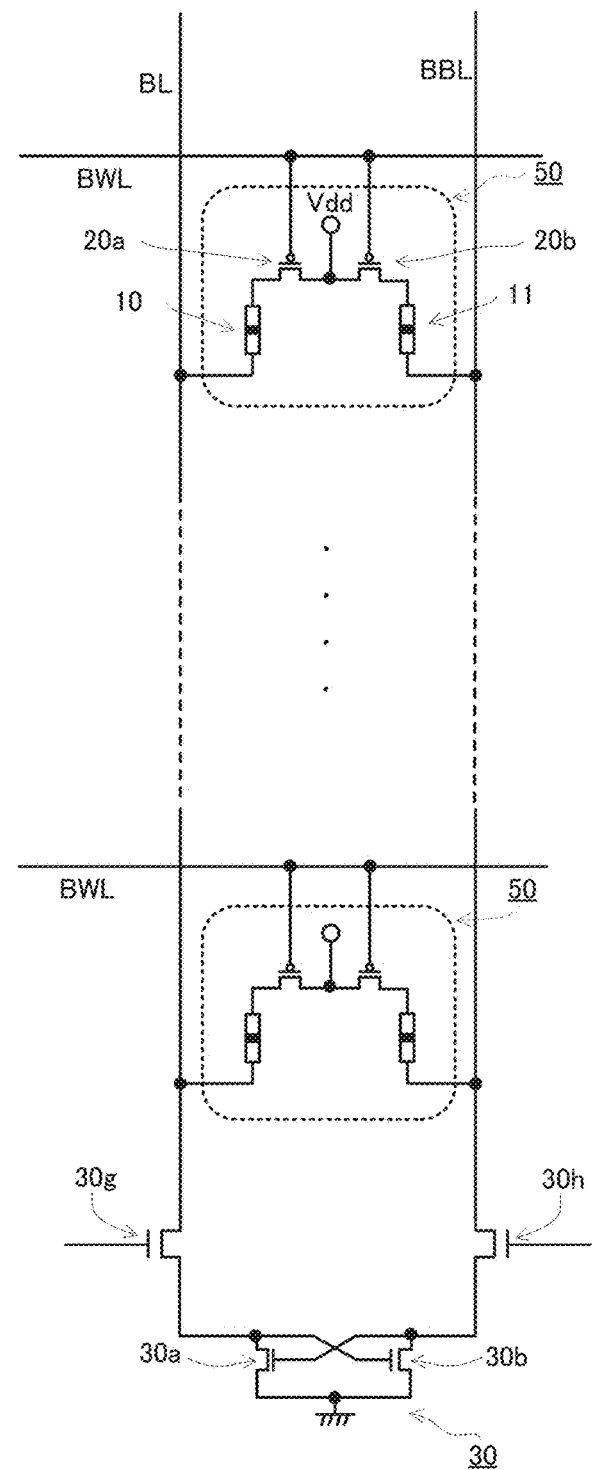
FIG. 26 is a drawing showing an exemplary variation of the memory circuit according to the first exemplary embodiment.

In addition to this, the present disclosure is not limited to the above-described exemplary embodiment, for various variations and applications are possible. For example, the circuit configuration, signal level and timing and/or the like can be appropriately altered. For example, as shown in FIG. 26, transfer gates 30g and 30h may be placed between the bit line and the sense circuit 30. In this case, the MOSFETs 30g and 30h comprising the transfer gates are preferably MOSFETs of the opposite conduction type as the MOSFET used for selection. In addition, as shown in FIG. 1 and FIG. 8, the relative positions of the MTJ and the selection transistor may be switched.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2013-252574, filed on Dec. 5, 2013, the entire disclosure of which is incorporated by reference herein.

INDUSTRIAL APPLICABILITY

With the present disclosure, the speed and capacity of STT-MRAM can be increased.

REFERENCE SIGNS LIST

10, 11 MTJ
10a, 11a Pin layer
10c, 11c Free layer
10b Insulating layer
20a, 20b, 20c, 20d, 20e, 20f, 20g, 20h, 20i p-type MOSFET
21a, 21b, 30a, 30b, 30c n-type MOSFET
25 Latch circuit
30 Sense circuit
33 Output buffer
34 Writing buffer
41a, 41b, 42a, 42b Transfer gate
50, 51 Memory cell
70 Sense amplifier
100, 1000, 2000 Memory circuit
sn, bsn Node
BL Bit line
BBL Bit line bar
BEQL, BROE, BSEP Control line
C/A Cell array
C1, C2 Capacitor
DQB Data Queue Buffer
EQL Equalizer
MUX Multiplexer
Read, SEP Control line
RWD, BRWD Data line
S/A Sense amplifier
SL Source line
Vdd Power source
WL Word line

The invention claimed is:

1. A semiconductor memory device comprising:
a plurality of memory cells, each comprising a first MOSFET and a first MTJ serially connected thereto, arranged between one of a pair of bit lines and one of a pair of source lines, a second MOSFET and a second MTJ serially connected thereto, arranged between other of the pair of bit lines and other of the pair of source lines;
a third MOSFET; and
a fourth MOSFET;
wherein the drain of the third MOSFET is connected to one of the pair of bit lines, the drain of the fourth MOSFET is connected to the other of the pair of bit lines, the gate of the third MOSFET is connected to the drain of the fourth MOSFET and the gate of the fourth MOSFET is connected to the drain of the third MOSFET.

2. The semiconductor memory device according to claim 1, wherein the first MOSFET and the second MOSFET are MOSFETs of a first conduction type, and the third MOSFET and the fourth MOSFET are MOSFETs of a second conduction type differing from the first conduction type.

3. The semiconductor memory device according to claim 2, wherein:
the drain of the third MOSFET is connected to one of the pair of bit lines via a fifth MOSFET, and the drain of the fourth MOSFET is connected to the other of the pair of bit lines via a sixth MOSFET; and
the fifth MOSFET and the sixth MOSFET are MOSFETs of the second conduction type.

4. The semiconductor memory device according to claim 2, wherein:
the sources of the third MOSFET and the fourth MOSFET are connected to a first common node, and the first common node is connected to a ground voltage or a power source voltage via a seventh MOSFET; and
the seventh MOSFET is a MOSFET of the second conduction type.

5. The semiconductor memory device according to claim 2, wherein:
the drain of an eighth MOSFET is connected to the drain of the third MOSFET, the drain of a ninth MOSFET is connected to the drain of the fourth MOSFET, the drain of the eighth MOSFET is connected to the gate of the ninth MOSFET, and the drain of the ninth MOSFET is connected to the gate of the eighth MOSFET; and
the eighth MOSFET and the ninth MOSFET are MOSFETs of the first conduction type.

6. The semiconductor memory device according to claim 5 wherein:
the sources of the eighth MOSFET and the ninth MOSFET are connected to a second common node, and the second common node is connected to a power source voltage or a ground voltage via a tenth MOSFET; and
the tenth MOSFET is a MOSFET of the first conduction type.

7. The semiconductor memory device according to claim 6, wherein when the tenth MOSFET turns on, the first MOSFET and the second MOSFET turn off.

8. The semiconductor memory device according to claim 3 wherein:
the drain of an eighth MOSFET is connected to the drain of the third MOSFET, the drain of a ninth MOSFET is connected to the drain of the fourth MOSFET, the drain of the eighth MOSFET is connected to the gate of the ninth MOSFET, and the drain of the ninth MOSFET is connected to the gate of the eighth MOSFET;
the eighth MOSFET and the ninth MOSFET are MOSFETs of the first conduction type;
the sources of the eighth MOSFET and the ninth MOSFET are connected to a second common node, and the second common node is connected to a power source voltage or a ground voltage via a tenth MOSFET;
the tenth MOSFET is a MOSFET of the first conduction type; and
when the tenth MOSFET turns on, the fifth MOSFET and the sixth MOSFET turn off.

9. The semiconductor memory device according to claim 2, wherein:
the pair of source lines is connected to a power source voltage or a ground voltage via an eleventh MOSFET and a twelfth MOSFET, respectively; and
the eleventh MOSFET and the twelfth MOSFET are MOSFETs of the first conduction type.

10. The semiconductor memory device according to claim 3, further comprising:
a thirteenth MOSFET and a fourteenth MOSFET are connected in parallel with the fifth and the sixth MOSFETs, respectively; and
wherein the thirteenth and the fourteenth MOSFETs are MOSFETs of the first conduction type.

11. The semiconductor memory device according to claim 10, wherein:
the sources of the third MOSFET and the fourth MOSFET are connected to a first common node, and the first common node is connected to a ground voltage or a power source voltage via a seventh MOSFET; and
the seventh MOSFET is a MOSFET of the second conduction type.

12. The semiconductor memory device according to claim 11, wherein:
the drain of an eighth MOSFET is connected to the drain of the third MOSFET, the drain of a ninth MOSFET is connected to the drain of the fourth MOSFET, the drain of the eighth MOSFET is connected to the gate of the ninth MOSFET, and the drain of the ninth MOSFET is connected to the gate of the eighth MOSFET; and
the eighth MOSFET and the ninth MOSFET are MOSFETs of the first conduction type.

* * * * *